(12) United States Patent
Matsumoto et al.

(10) Patent No.: US 9,196,850 B2
(45) Date of Patent: Nov. 24, 2015

(54) ORGANIC DEVICES, ORGANIC ELECTROLUMINESCENT DEVICES, ORGANIC SOLAR CELLS, ORGANIC FET STRUCTURES AND PRODUCTION METHOD OF ORGANIC DEVICES

(75) Inventors: Toshio Matsumoto, Fujisawa (JP); Akira Yokoi, Fujisawa (JP); Takeshi Nakada, Fujisawa (JP); Norifumi Kawamura, Fujisawa (JP); Junji Kido, Yonezawa (JP)

(73) Assignees: Junji Kido, Yonezawa, Yamagata-Ken (JP); ROHM Co., Ltd., Kyoto (JP); Mitsubishi Heavy Industries, Ltd., Tokyo (JP)

( * ) Notice: Subject to any disclaimer, the term of this patent is extended or adjusted under 35 U.S.C. 154(b) by 563 days.

(21) Appl. No.: 10/983,857

(22) Filed: Nov. 8, 2004

(65) Prior Publication Data

US 2005/0098207 A1 May 12, 2005

(30) Foreign Application Priority Data

Nov. 10, 2003 (JP) ................................. 2003-380338
Oct. 6, 2004 (JP) ................................. 2004-294120

(51) Int. Cl.
*H01L 51/54* (2006.01)
*H01L 51/42* (2006.01)
*H01L 51/50* (2006.01)
*H01L 51/52* (2006.01)
*H01L 51/00* (2006.01)

(52) U.S. Cl.
CPC .......... *H01L 51/424* (2013.01); *H01L 51/0077* (2013.01); *H01L 51/0079* (2013.01); *H01L 51/5048* (2013.01); *H01L 51/5052* (2013.01); *H01L 51/5068* (2013.01); *H01L 51/5088* (2013.01); *H01L 51/5092* (2013.01); *H01L 51/5278* (2013.01); *H01L 51/0051* (2013.01); *H01L 51/0067* (2013.01); *H01L 51/0071* (2013.01); *H01L 51/0078* (2013.01); *H01L 51/0081* (2013.01); *H01L 51/0089* (2013.01); *H01L 51/4253* (2013.01); *H01L 2251/308* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 4,539,507 A | 9/1985 | VanSlyke et al. | 313/504 |
| 4,769,292 A | 9/1988 | Tang et al. | 428/690 |
| 4,885,211 A | 12/1989 | Tang et al. | 428/457 |
| 5,009,958 A * | 4/1991 | Yamashita et al. | 428/411.1 |
| 5,155,566 A * | 10/1992 | Nakayama et al. | 257/40 |
| 5,670,792 A * | 9/1997 | Utsugi et al. | 257/59 |
| 5,707,745 A * | 1/1998 | Forrest et al. | 428/432 |
| 5,776,370 A * | 7/1998 | Afzali-Ardakani et al. | 252/500 |
| 6,013,384 A | 1/2000 | Kido et al. | 428/690 |
| 6,172,459 B1 * | 1/2001 | Hung et al. | 313/506 |
| 6,278,236 B1 * | 8/2001 | Madathil et al. | 313/504 |
| 6,337,492 B1 | 1/2002 | Jones et al. | 257/40 |
| 6,396,209 B1 * | 5/2002 | Kido et al. | 313/504 |
| 6,423,429 B2 | 7/2002 | Kido et al. | 428/690 |
| 6,573,650 B2 * | 6/2003 | Aoki et al. | 313/503 |

(Continued)

FOREIGN PATENT DOCUMENTS

| | | |
|---|---|---|
| EP | 0 120 673 A2 | 10/1984 |
| EP | 1 089 361 A2 | 4/2001 |
| EP | 1089361 | 4/2001 |
| EP | 1 011 155 B1 | 6/2003 |
| EP | 1 351 558 A1 | 10/2003 |
| EP | 1351558 | 10/2003 |
| EP | 0 936 844 B1 | 1/2004 |
| JP | 59-194393 | 11/1984 |
| JP | 63-215595 | 8/1988 |
| JP | 63-264692 | 11/1988 |

(Continued)

OTHER PUBLICATIONS

Endo et al., Jpn. J. Appl. Phys. (2002), vol. 41, No. 7A, Pt 2, L800-L803.*

(Continued)

*Primary Examiner* — Andrew K Bohaty
(74) *Attorney, Agent, or Firm* — McCormick, Paulding & Huber LLP

(57) ABSTRACT

An organic device has a hole current-electron current conversion layer which comprises a laminate of an electron transportation section and a hole transportation section. The electron transportation section includes a charge transfer complex formed upon an oxidation-reduction reaction between a reduced low work function metal and an electron-accepting organic compound, the reduced metal being produced upon an in-situ thermal reduction reaction caused upon contact, through lamination or mixing by co-deposition, of an organic metal complex compound or an inorganic compound containing at least one metal ion selected from ions of low work function metals having a work function of not more than 4.0 eV, and a thermally reducible metal capable of reducing a metal ion contained in the organic metal complex compound or the inorganic compound in vacuum to the corresponding metal state, and the electron transportation section having the electron-accepting organic compound in the state of radical anions. The hole transportation section includes an organic compound having an ionization potential of less than 5.7 eV and an electron-donating property and an inorganic or organic substance capable of forming a charge transfer complex upon its oxidation-reduction reaction with the organic compound, the organic compound and the inorganic or organic substance being contacted through lamination or mixing, and the electron-donating organic compound is in the state of radical cations.

6 Claims, 26 Drawing Sheets

(56) References Cited

U.S. PATENT DOCUMENTS

| | | | | |
|---|---|---|---|---|
| 6,579,629 | B1* | 6/2003 | Raychaudhuri et al. | 428/690 |
| 6,589,673 | B1 | 7/2003 | Kido et al. | 428/690 |
| 6,597,012 | B2* | 7/2003 | Kido et al. | 257/40 |
| 6,717,358 | B1* | 4/2004 | Liao et al. | 313/504 |
| 2003/0038593 | A1* | 2/2003 | Aziz et al. | 313/506 |
| 2003/0067000 | A1* | 4/2003 | Nelles et al. | 257/40 |
| 2003/0072967 | A1 | 4/2003 | Kido et al. | |
| 2003/0156080 | A1* | 8/2003 | Koike et al. | 345/60 |
| 2003/0189401 | A1* | 10/2003 | Kido et al. | 313/504 |
| 2004/0058194 | A1* | 3/2004 | Stossel et al. | 428/690 |
| 2004/0174116 | A1* | 9/2004 | Lu et al. | 313/506 |
| 2006/0035015 | A1* | 2/2006 | Raychaudhuri et al. | 427/66 |

FOREIGN PATENT DOCUMENTS

| | | |
|---|---|---|
| JP | 10-270171 | 10/1998 |
| JP | 11-233262 A2 | 8/1999 |
| JP | 11-251067 A2 | 9/1999 |
| JP | 11-329748 | 11/1999 |
| JP | 2000-58265 A2 | 2/2000 |
| JP | 2000-058267 | 2/2000 |
| JP | 2000-68063 A2 | 3/2000 |
| JP | 2000-182774 | 6/2000 |
| JP | 2001-102175 | 4/2001 |
| JP | 2001-244079 | 9/2001 |
| JP | 2001-142672 | 11/2002 |
| JP | 2002-332567 | 11/2002 |
| JP | 2003-45676 A2 | 2/2003 |
| JP | 2003-264085 | 9/2003 |
| JP | 2003-272860 | 9/2003 |
| JP | 2004-202266 A2 | 7/2004 |
| JP | 2003-358402 | 5/2005 |
| WO | 02/101838 A1 | 12/2002 |
| WO | 03/083958 A2 | 10/2003 |

OTHER PUBLICATIONS

Kido et al., JP 10-270171 (1998) machine assisted translation.*
47th lecture meeting, Associate of Society of Applied Physics and others, preprint 30a-H-2, p. 1297.
European Search Report. Dated: Nov. 7, 2007.
Shizuo, Tokito, et al. Metal oxides as a hole-injecting layer for an organic electroluminescent device. Dated: Jul. 22, 1996. XP 000694594.
G. Parthasarathy, et al. Lithium doping of semiconducting organic charge transport materials. Journal of Applied Physics vol. 89, No. 9. Dated: May 1, 2001.
"Metal oxides as a hole-injecting layer for an organic electroluminescent device", S. Tokito et al., Journal of Physics D. Applied Physics, vol. 29, No. 11 (1996), pp. 2750-2753.
"Molecular material based junctions: Formation of a Schottky contact with metallophthalocyanine thin films doped by the cosublimation method", M. Maitrot et al., Journal of Applied Physics, vol. 60, No. 7 (1986), pp. 2396-2400.
"Organic Electroluminescent Devices having Metal Complexes as Cathode Interface Layer", J. Endo et al., Jpn. J. Appl. Phys., vol. 41, No. 7A, Part 2 (2002), pp. L800-L803.
"Bipolar transport organic light emitting diodes with enhanced reliability by LiF doping", V. Choong et al., Applied Physics Letters, AIP, vol. 76, No. 8 (2000), pp. 958-960.
"Lithium doping of semiconducting organic charge transport materials", G Parthasarathy et al., Journal of Applied Physics, AIP, vol. 89, No. 9 (2001), pp. 4986-4992.
"Transparent-cathode for top-emission organic light-emitting diodes", S. Han, Applied Physics Letters, vol. 82, No. 16 (2003), pp. 2715-2717.
Copy of European Search Report for Serial No. EP 04 02 6734, dated Apr. 12, 2006.
"Two-layer organic photovoltaic cell", C. W. Tang, Appl. Phys. Lett. vol. 48, pp. 183-185 (1986).
"High photovoltage multiple-heterojunction organic solar cells incorporating interfacial metallic nanocluster", A. Yakimov et al., Appl. Phys. Lett. vol. 80, pp. 1667-1669 (2002).
"Effect of Thin Gold Interstitial-layer on the Photovoltaic Properties of Tandem Organic Solar Cell", Masahiro Hiramoto, et al. Chemistry Letters, pp. 327-330 (1990).
49th lecture meeting, Associate of Society of Applied Physics and others, preprint 27p-YL-3, p. 1308.
63rd Lecture Meeting, Society of Applied Physics, preprint 27a-ZL-12, p. 1165.
Proceedings of EL 2002 Ghent (2002 International Conference on the Science and Technology of Emissive Displays and Lighting), Sep. 2002, pp. 3, 4, 537, 539.
Proceedings of IDMC '03 (International Display Manufacturing Conference) Fr-21-01, pp. 411, 413-414.
SID03 Digest vol. XXXIV, Book II, pp. 979-981.
13th FPD Manufacturing Technology Expo & Conference, D-4 (2003).
Exhibition and distribution materials; EExpress (Nov. 15, 2002), of white light emitter by IMES Co., Ltd. at LCD/PDP International 2002.
"Organic EL Devices Having Lewis-Acid-Doped Polymer as a Hole-Injecting Layer", T. Dao et al. Journal of Photopolymer, Sci. Technol., vol. 15, pp. 261-264 (2002).
IDW '04 Advance Program, p. 60, OLED2-4, Novel Mg.: $Alq_3/WO_3$, Connecting Layer for Tandem White Organic Emiting Diodes (WOLEDs), C.-C. Chang, S.-W. Hwang, H.-H. Chen, C.H. Chen, J.-F Chen (2004); pp. 1285-1288.
"Organic Electroluminescent Devices with a Vacuum-Deposited Lewis-Acid-Doped Hole-Injecting Layer", Endo et al. Jpn. J. Appln. Phys., vol. 41 (2002) L358-L360.
47th Meeting of Japanese Society of Polymer, Preprint, vol. 47, No. 9, p. 1940-1941 (1998).
"Very-low-operating-voltage organic light-emitting diodes using a p-doped amorphous hole injection layer" Leo et al., Appl. Phys. Lett., vol. 78, No. 4, 2001, pp. 410-412.
39th Lecture Meeting, Associate of Society of Applied Physics, Preprint 28p-Q-9, p. 1036 (1992).
"Efficient Photon harvesting at high optical intensities in ultrathin organic double-heterostructure photovoltaic diodes" Appl. Phys. Lett. 76, vol. 19, pp. 2650-2651 (2000).
"Very-high-efficiency double-heterostructure copper phthalocyanine $C/_{60}$ photovoltaic cells", Appl. Phys. Lett. vol. 79, No. 1, pp. 126-128 (2001); and.
63rd lecture meeting, Associate of Society of Applied Physics and others, Preprint 26p-ZH-15, p. 1161.
"Organic electroluminescent diodes"C. W. Tang and S. A. VanSlyke, Appln. Phys. Lett. 51 (Sep. 21, 1987)., pp. 913-915.
"Bright organic electroluminescent devices having a metal-doped electron-injecting layer", J. Kido, et al., Applied Physics Letters, vol. 73, Nov. 1998, No. 20, pp. 2866-2868.
Jpn. J. Appln. Phys. vol. 41 (2002), pp. L800, pp. L800-L803.
Copy of U.S. Appl. No. 10/966,251, filed Oct. 15, 2004 entitled "Organic Electroluminescent Device".

* cited by examiner

ORGANIC DEVICES, ORGANIC ELECTROLUMINESCENT DEVICES, ORGANIC SOLAR CELLS, ORGANIC FET STRUCTURES AND PRODUCTION METHOD OF ORGANIC DEVICES

CROSS REFERENCE TO RELATED APPLICATIONS

The present application is related to and claims priority of the following priority applications, namely, Japanese Patent Application Nos. 2003-380338 filed on Nov. 10, 2003, and 2004-294120 filed on Oct. 6, 2004, and incorporates by reference said priority applications herein.

BACKGROUND OF THE INVENTION

1. Field of the Invention

The present invention relates to an organic device or an element using an organic charge-transporting compound including, for example, an organic electroluminescent device (hereinafter, abbreviated as an "organic EL device"), an organic solar cell, an organic semiconductor device such as organic FET device and others, and a process for the production of such an organic device.

2. Description of the Related Art

Recently, organic semiconductors and organic conductive materials have been actively studied, and in particular, remarkable advances have been achieved in light-emitting organic EL devices which use an organic semiconductor.

Tang et al. have been successful in achieving organic EL devices which have high luminance and high efficiency sufficient for practical application such as a luminance of 1,000 cd/m² and an external quantum efficiency of 1% at an applied voltage of not more than 10V, if a laminate structure of organic compounds having different carrier transporting properties (organic hole-transporting compounds and organic electron-transporting compounds) are applied to the devices, along with a balanced injection of holes and electrons from an anode and cathode, respectively, and if a thickness of the organic layer sandwiched between the cathode and the anode is controlled to not more than 2,000 Å (cf. Tang et al., Appl. Phys. Lett., 51, 913 (1987); Japanese Patent Application Laid-open Nos. 59-194393, 63-264692 and 2-15595; and U.S. Pat. Nos. 4,539,507, 4,769,292 and 4,885,211).

Moreover, Tang et al. were able to achieve a power conversion efficiency of approximately 1% by laminating organic compounds having different carrier transporting properties (CuPc as an organic hole-transporting compound and PV as an organic electron-transporting compound) in organic solar cells (cf. Tang et al., Appl. Phys. Lett., 48, 183(1986)).

More recently, for the purpose of obtaining a high efficiency in organic devices, various ideas based on the structure such that a plurality of above-mentioned laminated portion (that used to be sandwiched by the electrodes in prior arts) is stacked and connected in series in terms of circuit have been suggested in technical articles and patent literatures (cf. Appl. Phys. Lett., 80, 1667 (2002); Chemistry Letters, pp. 327-330 (1990); Japanese Patent Application Laid-open No. 11-329748; U.S. Pat. No. 6,337,492; and Japanese Patent Application Laid-open Nos. 2003-45676 and 2003-264085).

In particular, the inventor of the present invention has disclosed an serial connection of two or more organic light-emitting EL units in terms of circuit by using an electrically insulating charge generation layer having a resistivity (specific resistance) of not less than $10^2$ Ωcm in Japanese Patent Application Laid-open No. 2003-272860. The inventor of the present invention has named the resulting device an organic MPE (Multi-Photon Emission) EL device, and has disclosed and exhibited, received high evaluation, in many conferences, exhibitions, etc., (cf. 49th lecture meeting, Associate of Society of Applied Physics and others, Preprint 27p-YL-3, p. 1308; 63rd lecture meeting, Society of Applied Physics, preprint 27a-ZL-12, p. 1165; Proceedings of EL2002 (International Conference on the Science and Technology of Emissive Device and Lighting), p. 539; Proceedings of IDMC'03 (International Display Manufacturing Conference), Fr-21-01, p. 413; SID03 DIGEST, Vol. XXXIV, BOOKII, p. 979; 13th lecture meeting, Production Technology Exhibition of Flat Panel Display, D-4(2003); and exhibition and distribution materials, EExpress (Nov. 15, 2002), of white light emitter by IMES Co., Ltd. at LCD/PDP International 2002). Hereinafter, the organic MPE (multi-photon emission) EL device is referred to as a "MPE" device.

The charge generation layer has a structure which is similar to those obtained by laminating, in sequence, the different sorts of charge injection layers (for electron injection and hole injections), which used to be disposed adjacent to the electrodes (cathode and anode) and were invented and have been improved by the inventor of this application. Namely, the charge generation layer is produced by laminating, in sequence, a layer containing radical anion molecules of an organic electron-accepting (electron-transporting) compound produced upon reduction of the electron-accepting compound with a reducing (electron-donating) agent such as alkaline metal, for example, those disclosed in Japanese Patent Application Laid-open Nos. 10-270171 (U.S. Pat. No. 6,013,384) and 2001-102175 (U.S. Pat. No. 6,589,673), and a layer containing radical cation molecules of an organic electron-donating (hole-transporting) compound produced upon oxidation of the electron-donating compound with an oxidizing (electron-accepting) agent such as $V_2O_5$, $MoO_3$, and $WO_3$, $F_4$-TCNQ represented by the following formula:

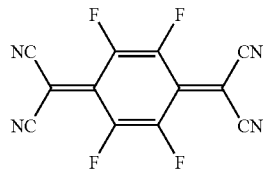

or PNB represented by the following formula:

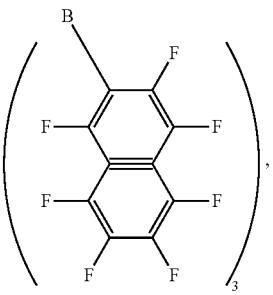

for example, those disclosed in Japanese Patent Application Laid-open Nos. 11-251067 (U.S. Pat. No. 6,423,429), 2001-244079 (U.S. Pat. No. 6,589,673), 2003-272860 and 2003-358402, and the specification of Patent Application No. 2004-202266. Reference literature: K. L. T. Dao and J. Kido, J.

Photopolym. sci. Technol., 15, 261 (2002) (Reference literature: IDW '04 Advance Program, p. 60, OLED2-4, Novel Mg:Alq$_3$/WO$_3$ Connecting Layer for Tandem White Organic Light Emitting Diodes (WOLEDs), C.-C. Chang, S.-W. Hwang, H.-H. Chen, C. H. Chen, J.-F. Chen (2004)).

It has been proved that if the portion, i.e., light-emissive units, which used to be sandwiched by the cathode and anode in the conventional organic EL devices, are stacked via the above-described charge generation layer, light emission intensity per current density (i.e., quantum efficiency or current efficiency, denoted as (cd/A)) are multiplied by approximately (n+1) times (n: the number of charge generation layers), because electrons and holes can move from the charge generation layer to the direction of anode and cathode respectively upon voltage application and recombine with each other in the multiple emissive units, and thus photons can be generated in the multiple light-emissive units.

In this case, since the driving voltage is also increased to approximately (n+1) times, it was expected in theory that the power conversion efficiency cannot be substantially improved or changed.

However, it is appreciated upon more precise and detailed study that when organic MPE EL devices are produced under optimized conditions, it becomes possible to achieve corresponding improvement effects even in the power conversion efficiency. Here, it is well-known that the mobility (denoted as (cm$^2$·V$^{-1}$·S$^{-1}$)) of the organic semiconductor is much lower than that of the inorganic semiconductor in a different order, and thus it is necessary to apply an "additional voltage" to the EL devices to obtain the desired current level. The term "additional voltage" used herein means an additionally required voltage to obtain a current density necessary to discharge the desired and much amounts of photons per the unit time, in addition to the device voltage of 2V, for example, which is at least necessary to discharge photons of 2 eV, and in this case, it is represented by the formula: (additional voltage)=(driving voltage−2V). Accordingly, as for an organic EL device in which the luminance is proportional only to the current density, the power conversion efficiency in the high luminance region is made lower than that of the low luminance region, as is appreciated from the graph of FIG. 24.

However, comparing MPE EL devices with conventional EL devices under the same luminance, the MPE devices show a required current density of approximately 1/(n+1), wherein n is a number of the charge generation layers, and thus the potential (voltage) consumed per each light emissive unit is lower than the potential (voltage) consumed in conventional EL devices. Accordingly, in practice a total amount of the electrical power consumption is lowered, i.e., the power conversion efficiency is improved, in MPE devices. FIG. 24 shows the results of the simulation tests in which the light emissive units of the conventional organic EL device were stacked through different numbers of the charge generation layers to make the EL devices having 2 units (n=1), 5 units (n=4) or 10 units (n=9), and the power conversion efficiency (lm/W) of each device was determined as a function of the luminance to ascertain how the power conversion efficiency is varied with the change of luminance. Note in the graph of FIG. 24 that it is the simulated results on the assumption that the current efficiency (cd/A) is exactly increased to (n+1) times wherein n is a number of the charge generation layers, and also the driving voltage is exactly increased to (n+1) times under the application of the same current density (not the same luminance). The plotted line for 1 unit (n=0) in FIG. 24 represents conventional organic EL devices and the data thereof were acquired from the EL device which was actually fabricated.

The MPE devices showing good performances like ones plotted in FIG. 24 cannot be realized with ease. For example, when the voltage required for '(n+1) stacked MPE device' to achieve a current density is larger than (n+1) times the voltage required for the corresponding conventional device (n=0), i.e. in the case that undesirable, "excess voltage (ΔV)" is required every time when the charge generation layer is inserted between the light emissive units, it is appreciated that the power conversion efficiency of the MPE devices is lowered with increase in the stacking number of the light emissive units FIGS. 25 and 26 each shows a band diagram of the organic MPE EL device having two light emissive units. Undesirable "excess voltage (ΔV)" is generated within the charge generation layer section. Needless to say, but if precisely described, the generation (injection) of holes in the organic EL devices means the withdrawal of electrons from the HOMO (Highest Occupied Molecular Orbital) of the electron-donating molecules (hole-transporting molecules), i.e., formation of radical cation state of the hole-transporting molecules, whereas the generation (injection) of electrons in the organic EL devices means the injection of electrons into the LUMO (Lowest Unoccupied Molecular Orbital) of the electron-accepting molecules (electron-transporting molecules), i.e., formation of radical anion state of the electron-transporting molecules, upon application of voltage.

Accordingly, the role of the charge generation layer in the MPE devices resides in withdrawal of the electrons from HOMO of the hole-transporting molecule in one light-emissive unit appearing on a cathodic side of the charge generation layer and in injection of the electrons (withdrawn from HOMO) into the LUMO of the electron-transporting molecule in another light-emissive unit appearing on an anodic side of the charge generation layer, upon voltage application.

Namely, the "excess voltage (ΔV)" can be ascribed to an "energy barrier" during the electron transfer from the HOMO to the LUMO in the charge generation layer (where hole current is converted to electron current). In this respect, the transfer of the electrons from the HOMO to the LUMO refers to the conversion of the hole current to the electron current.

Accordingly, the above-described MPE devices showing good performance can be achieved by enabling the "excess voltage (ΔV)" to be approached to substantially zero as a result of diminishing the energy barrier for electron transfer within the hole-electron conversion layer to substantially zero, as shown in FIG. 26.

As a result of research and development, the inventor of the present invention has discovered that the ideal "hole current-electron current conversion" could be realized by diminishing the energy barrier to substantially zero. Specifically, it has been discovered that the hole current in the HOMO level can be converted to the electron current in the LUMO level without any energy barrier, if a thermal reduction reaction-generated layer containing radical anion molecules of the electron-accepting organic compound produced upon the thermal reduction reaction according to the methods described in detail in Japanese Patent Application Laid-open No. 11-233262 and Japanese Patent Application Laid-open No. 2000-182774 (U.S. Pat. No. 6,396,209, US Patent Application Publication 20030072967, EP0936844B1, EP1011155B1 as well as J. Endo, T. Matsumoto and J. Kido, Jpn. J. Appl. Phys., Vol. 41(2002) pp. L800-L803), and a layer containing radical cation molecules of the electron-donating organic compound produced through the oxidizing molecules, which is formed according to the methods described in detail in Japanese Patent Application Laid-open Nos. 11-251067 (U.S. Pat. No. 6,423,429), 2001-244079 and 2003-272860 (cf. Endo et al., Jpn. J. Appln. Phys., Vol. 41 (2002) L358, 47th Meeting of Japanese Society of Polymer, Preprint, Vol. 47, No. 9, p. 1940 (1998) and Leo et al., Appl. Phys. Lett., Vol. 78, No. 4, 2001), are stacked in that order.

However, in the case that the radical anion molecules of the electron-accepting organic compound are produced by using the other method also disclosed by the inventors of the present invention, which is described in detail in Japanese Patent Application Laid-open Nos. 10-270171 (U.S. Pat. No. 6,013,384) and 2001-102175 (U.S. Pat. No. 6,589,673) as well as J. Kido and T. Matsumoto, Appl. Phys. Lett., 73, p. 2866 (1998), i.e., the radical anion molecules are produced through direct doping of electron donors (reducing dopants) such as alkaline metals, problems arise such as undesirable reactions occurring unintentionally between the electron donors (reducing agents) and the electron acceptors (oxidizing agents), between the electron-accepting organic compound and the oxidizing agents, and also between the electron-donating molecules (hole-transporting molecules) and the electron donors (reducing agents), to thereby make difficult the transfer of the electrons.

In fact, the inventor has discovered through study and examination of MPE devices that if the above-mentioned technique (i.e., direct doping) is employed for the generation of radical anion state, the "excess voltage ($\Delta V$)" cannot approach to zero. (i.e., the driving voltage exceeds (n+1) times the voltage of the corresponding conventional device (i.e., n=0) at a current density, wherein (n+1) is the number of the light emissive units contained in the MPE device.)

This increasing tendency of the driving voltage is particularly noticeable in a region of the high current density or high luminance, i.e., the excess voltage ($\Delta V$) has a current density dependency. Examples of MPE devices having such undesirable states are disclosed in Japanese Patent Application Laid-open Nos. 2003-45676 and 2003-272860, proposed by the inventors of this application.

SUMMARY OF THE INVENTION

The present invention solves the above-described problems of the organic devices of prior art by using the hole current-electron current conversion layer (hole-electron conversion layer, including two layers sequentially stacked, i.e., one layer acting as an electron transportation section and the other layer acting as a hole transportation section) and its specific advantages, in a variety of organic devices, for example, by not only applying to a charge generation layer in the organic MPE EL devices, but also applying to a connection layer in tandem-connected organic solar cells (for the purpose of connecting in series two or more conventional single solar cell structure), and also applying to a buffer layer during the formation of electrodes of various organic devices, in common.

It is satisfactory if the organic device according to the present invention includes a hole current-electron current conversion layer (hole-electron conversion layer) which is a laminated or stacked product of:

(1) an electron transportation section (thermal reduction reaction-generated layer) in which, to produce radical anion state of an electron-accepting organic compound, a compound which may be either an organic substance or an inorganic substance and contains at least one metal ion selected from ions of low work function metals having a work function of not more than 4.0 eV (typical examples of which include alkaline metal ions, alkaline earth metal ions, rare earth metal ions and some transition metal ions) and a thermally reducible metal such as aluminum capable of reducing said metal ion in the above compound in vacuum, for example, in an atmosphere of a vacuum deposition chamber, to the corresponding metal state are contacted and reacted through lamination (by vacuum deposition) or mixed by co-deposition to produce a reduction product (i.e., the low work function metal) through the thermal reduction reaction, followed by forming a charge transfer complex upon an oxidation-reduction reaction (based on donation and acceptance of electrons) between the reduction product (i.e., the low work function metal) and an electron-accepting organic compound appearing near the reduction product, thereby making the electron-accepting compound in the state of radical anions; and (2) a hole transportation section in which (a) an organic compound having an ionization potential of less than 5.7 eV and an electron-donating property, i.e., hole-transporting property, and (b) an inorganic or organic substance capable of forming a charge transfer complex upon an oxidation-reduction reaction (based on donation and acceptance of electrons) with the organic compound are contacted through lamination or mixing, thereby making the electron-donating organic compound (a) in a state of radical cations. In this organic device, the use or application method of the hole-electron conversion layer is not restricted to a specific one.

According to an aspect of the present invention, an organic device having a hole current-electron current conversion layer is provided, including a laminate of an electron transportation section and a hole transportation section. The electron transportation section includes a charge transfer complex formed upon an oxidation-reduction reaction between a reduced low work function metal and an electron-accepting organic compound, the reduced metal being produced upon an in-situ thermal reduction reaction caused upon contact, through lamination or mixing by co-deposition, of an organic metal complex compound or an inorganic compound including at least one metal ion selected from ions of low work function metals having a work function of not more than 4.0 eV, and a thermally reducible metal capable of reducing a metal ion contained in the organic metal complex compound or an inorganic compound in vacuum to the corresponding metal state, and the electron transportation section having the electron-accepting organic compound in the state of radical anions. The hole transportation section includes an organic compound having an ionization potential of less than 5.7 eV and an electron-donating property and an inorganic or organic substance capable of forming a charge transfer complex upon its oxidation-reduction reaction with the organic compound, the organic compound and the inorganic or organic substance being contacted through lamination or mixing, and the electron-donating organic compound is in the state of radical cations.

According to other aspect of the present invention, an organic device having a hole current-electron current conversion layer is provided, including a laminate of an electron transportation section and a hole transportation section. The electron transportation section includes an organic metal complex compound or an inorganic compound including at least one metal ion selected from ions of low work function metals having a work function of not more than 4.0 eV, and a thermally reducible metal capable of reducing a metal ion contained in the organic metal complex compound or the inorganic compound in vacuum to the corresponding metal state, upon contact, through its lamination or mixing by co-deposition, to the organic metal complex compound or the inorganic compound. A charge transfer complex is formed upon an oxidation-reduction reaction between a reduced low work function metal and an electron-accepting organic compound, the reduced metal being produced upon an in-situ thermal reduction reaction caused upon the contact, and the electron-accepting organic compound is in the state of radical anions. The hole transportation section includes an organic compound having an ionization potential of less than 5.7 eV and an electron-donating property, and an inorganic or organic substance capable of forming a charge transfer complex through its oxidation-reduction reaction with the organic compound upon contact through its lamination or mixing to the organic compound, and the electron-donating organic compound is in the state of radical cations.

It is desirable for the organic metal complex compound or the inorganic compound and the electron-accepting organic compound to be in contact with each other through lamination or mixing.

An organic portion coordinated or bonded to a metal ion in the organic metal complex compound can act as the electron-accepting organic compound.

It is desirable for the organic metal complex compound and the electron-accepting organic compound to be the same.

It is desirable for the thermally reducible metal to include at least one member selected from the group consisting of aluminum, zirconium, silicon, titanium and tungsten.

It is desirable for thermally reducible metal to include at least one member selected from alkaline earth metals consisting of magnesium, calcium, strontium and barium, and the ion of low work function metals having a work function of not more than 4.0 eV contained in the organic metal complex compound or the inorganic compound is an alkaline metal ion.

It is desirable for the electron-donating organic compound to be an arylamine compound represented by the following formula (I):

in which $Ar_1$, $Ar_2$ and $Ar_3$ each represents an aromatic hydrocarbon group which may have substituents independently.

It is desirable for the electron-donating organic compound to be a pigment type organic compound.

It is desirable for the electron-donating organic compound to be a porphyrin compound or a derivative thereof.

It is desirable for the electron-donating organic compound to be a quinacridone compound or a derivative thereof.

It is desirable for the electron-donating organic compound to be an indanthrene compound or a derivative thereof.

It is desirable for the electron-donating organic compound to be an arylamine compound having a glass transition temperature of not lower than 90° C.

It is desirable for the inorganic substance capable of forming a charge transfer complex upon its oxidation-reduction reaction with the electron-donating organic compound to be metal oxide.

It is desirable for the inorganic substance capable of forming a charge transfer complex upon its oxidation-reduction reaction with the electron-donating organic compound to be metal halide.

It is desirable for the metal oxide to be vanadium pentoxide or dirhenium heptoxide or molybdenum trioxide or tungsten trioxide.

It is desirable for the organic substance capable of forming a charge transfer complex upon its oxidation-reduction reaction with the electron-donating organic compound to include at least one fluorine atom as a substituent.

It is desirable for the organic substance capable of forming a charge transfer complex upon its oxidation-reduction reaction with the electron-donating organic compound to include at least one cyano group as a substituent.

It is desirable for the organic substance capable of forming a charge transfer complex upon its oxidation-reduction reaction with the electron-donating organic compound simultaneously includes at least one fluorine atom and at least one cyano group as the substituent.

It is desirable for the organic substance capable of forming a charge transfer complex upon its oxidation-reduction reaction with the electron-donating organic compound to include tetrafluoro-tetracyanoquinodimethane.

It is desirable for the organic substance capable of forming a charge transfer complex upon its oxidation-reduction reaction with the electron-donating organic compound to include at least one boron atom.

It is desirable for the organic substance capable of forming a charge transfer complex upon its oxidation-reduction reaction with the electron-donating organic compound simultaneously to include at least one boron atom and at least one fluorine atom.

It is desirable for the organic substance capable of forming a charge transfer complex upon its oxidation-reduction reaction with the electron-donating organic compound to include tris-β-(pentafluoronaphthyl) borane.

An organic device can include the organic electroluminescent device.

An organic device can include the organic solar cell.

An organic device can includes the organic field effect transistor structure.

An organic electroluminescent device can include the organic device.

An organic solar cell can include the organic device.

An organic field effect transistor structure can include the organic device.

According to other aspect of the present invention, a process for the production of an organic device can include the steps of:

providing an in-situ thermal reduction reaction by contacting, through lamination or mixing by co-deposition, an organic metal complex compound or an inorganic compound including at least one metal ion selected from ions of low work function metals having a work function of not more than 4.0 eV, and a thermally reducible metal capable of reducing a metal ion contained in the organic metal complex compound or the inorganic compound in vacuum to the corresponding metal state;

subjecting a reduced low work function metal produced upon the in-situ thermal reduction reaction and an electron-accepting organic compound to an oxidation-reduction reaction to form a charge transfer complex, thereby forming the electron transportation section in which the electron-accepting organic compound is in the state of radical anions; and contacting, through lamination or mixing by co-deposition, an organic compound having an ionization potential of less than 5.7 eV and an electron-donating property and an inorganic or organic substance capable of forming a charge transfer complex upon its oxidation-reduction reaction with the electron-donating organic compound to form the hole transportation section in which the electron-donating organic compound is in the state of radical cations.

DESCRIPTION OF THE PREFERRED EMBODIMENTS

First Embodiment

Figure 1:
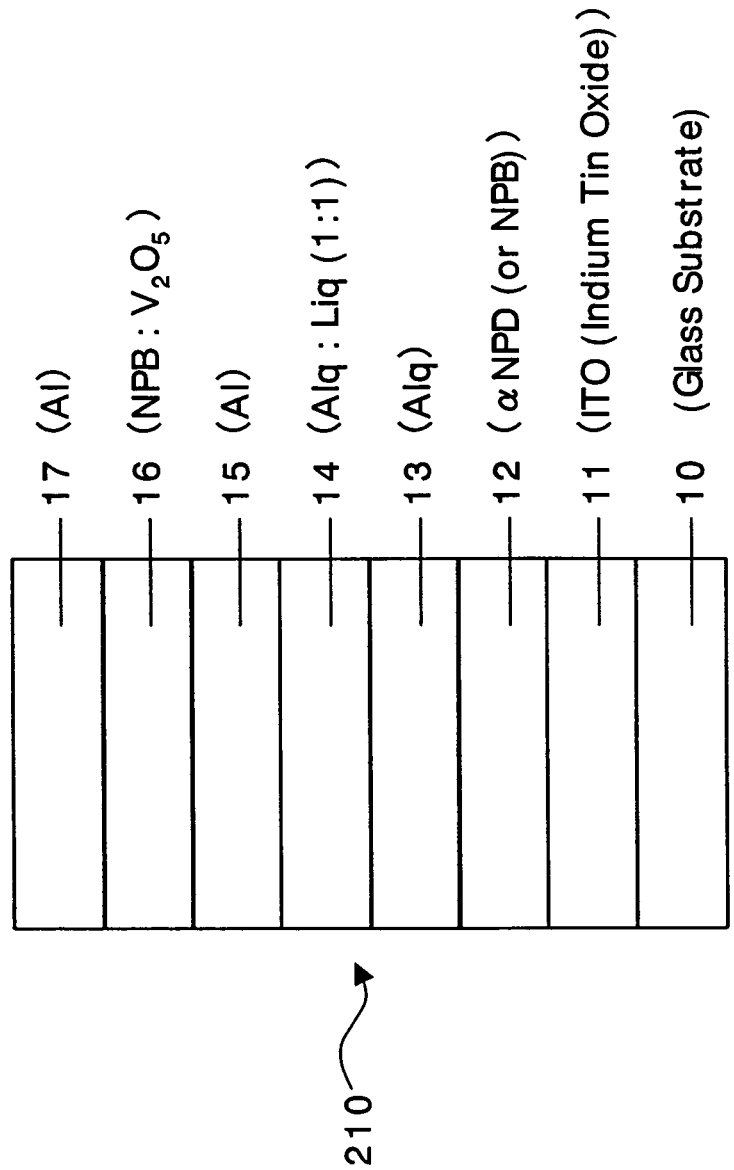
FIG. 1 is a cross-sectional view schematically showing the structure of the organic EL device according to Example 1 of the present invention.

In the first embodiment of the present invention, a lithium complex of (8-quinolinolato) (hereinafter, referred to as "Liq") represented by the following formula:

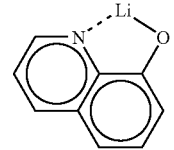

is used as an organic metal compound containing ions of low work function metals (for example, alkaline metals) having a work function of not more than 4.0 eV, typically alkaline metal ions, alkaline earth metal ions, rare earth metal ions and some transition metal ions, in the formation of the electron transportation section (thermal reduction reaction-generated layer).

Furthermore, an organic compound such as an aluminum complex of tris(8-quinolinolato) (hereinafter, referred to as "Alq") represented by the following formula:

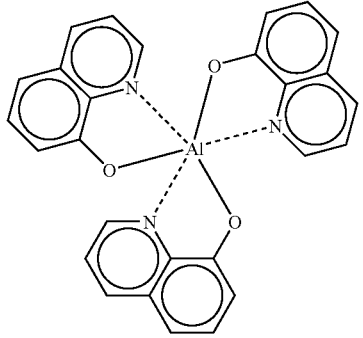

or bathocuproine (hereinafter, referred to as "BCP") represented by the following formula:

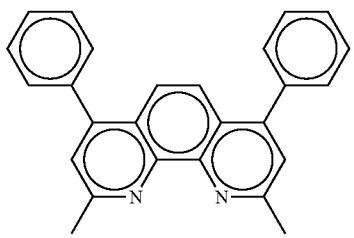

is used as an organic electron-accepting (electron-transporting) compound. According to one suitable method for forming the electron transportation section according to the present invention, the above organic compounds are formed in due course as a mixed layer by the co-deposition method, and then an appropriate amount of aluminum, which is a typical example of the thermally reducible metal, is vacuum deposited onto the mixed layer. During this vacuum deposition process, since the aluminum metal can reduce the alkaline metal ion (for example, $Li^+$ in Liq) as a result of the in-situ thermal reduction reaction, the aluminum metal is naturally converted to its oxidized state, i.e., the aluminum metal is changed into an aluminum ion-containing compound. On the other hand, the Li metal produced upon said thermal reduction is then subjected to an oxidation-reduction reaction with the organic electron-accepting (electron-transporting) compound (for example, Alq) appearing near the Li metal generated there, thereby forming a charge transfer complex like $\{Li^+.Alq^-\}$. The oxidation-reduction reaction is based on the donation and acceptance of electrons, and is represented by the following schema.

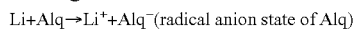
Li+Alq→Li⁺+Alq⁻ (radical anion state of Alq)

The resulting radical anions can act as a carrier (internal charge) of the electron current. The thus formed thermal reduction reaction-generated layer, if compared with a pure organic compound, is generally characterized by showing a high transparency and further showing a reduced resistivity, i.e., increased conductivity, in comparison with the pure organic compound. Accordingly, the increased conductivity may be mistakenly interpreted as being obtained due to the incorporation of metals such as aluminum in the fabrication process of the layer. However, it should be noted that, as described above, there is no aluminum in the metal atom in the thermal reduction reaction-generated layer, and in fact there is only aluminum in the state of ions (oxidized state). The good transparency can be obtained based on this mechanism, accordingly. Further, the improvement of the conductivity is based on the formation of the above-described radical anion molecule (like $Alq^-$) (cf. Examples 4 and 5).

The amount of aluminum used as a thermally reducible metal is preferably just the right amount suitable for reducing ions in the alkaline metal ion-containing compound to the corresponding metal. If an insufficient amount of aluminum is used, it becomes impossible to cause a sufficient thermal reduction reaction, and as a result, no radical anion of organic electron-accepting (-transporting) compound can be produced. On the other hand, if an excess amount of aluminum is used, a metal aluminum which could not contribute to the thermal reduction reaction, i.e., could not be converted to the oxidized state, can remain. Since the remaining metal aluminum can reduce the transparency of the deposited layer, it becomes impossible to expect desired effects. This phenomenon will be explained in the appended Example 4.

Second Embodiment

In the second embodiment of the present invention, as in the first embodiment described above, an organic metal complex containing alkaline metal ions such as Liq as an organic metal compound containing ions of low work function metals (for example, alkaline metals), an organic electron-accepting (-transporting) compound such as Alq and a thermally reducible metal such as aluminum can be used in the formation of the electron transportation section (thermal reduction reaction-generated layer). These three compounds can be simultaneously deposited and mixed (ternary co-deposition) to form the electron transportation section having the functions similar to those of the first embodiment. In this co-deposition process, when a deposition rate of the three compounds is suitably and precisely controlled, it becomes possible in the organic devices to obtain a layer having a high transparency and a good (low) resistivity comparable to that of the electron transportation layer having incorporated therein a reducing dopant disclosed by the inventor of this application in Japanese Patent Application Laid-open Nos. 10-270171 and 2001-102175 (cf. Example 5). Of course, since substantially all of the reducing dopant, typically alkaline metals, have a high reactivity which will take fire in an atmosphere, the process of the present invention is advantageous in the fact that the careful handling of such reactive dopant metals can be omitted from the procedure of the device fabrication.

Third Embodiment

In the third embodiment of the present invention, an organic metal complex containing rare earth metal ions such as an europium complex of tri(1,3-phenyl-1,3-propanedionato)mono(bathophenanthroline) (hereinafter, referred to as "Eu(DBM)3.BPEHEN") represented by the following formula:

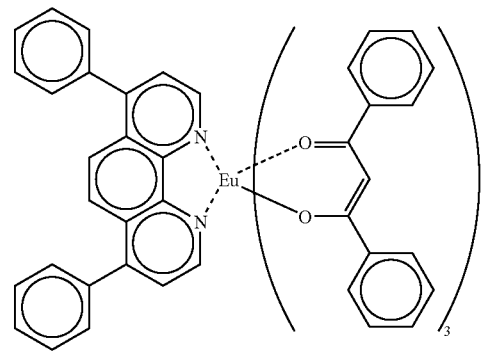

in which one of the ligands is a compound which shows the electron-accepting (-transporting) property by itself, for example, bathophenanthroline) (hereinafter, referred to as "BPEHEN") represented by the following formula:

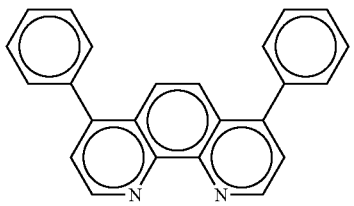

can be used in the formation of the electron transportation section (thermal reduction reaction-generated layer). The compound Eu(DBM)3.BPEHEN and a thermally reducible metal such as aluminum can be simultaneously deposited and mixed (binary co-deposition) to form the electron transportation section having the functions similar to those of the first and second embodiments. In this co-deposition process, when a deposition rate of the two compounds is suitably and precisely controlled, it becomes possible for the organic device to obtain a layer having a high transparency and a good (low) resistivity comparable to that of the electron transportation layer having incorporated therein a reducing dopant disclosed by the inventors of this application in Japanese Patent Application Laid-open Nos. 10-270171 and 2001-102175. The functions are based on the formation of BPE-HEN⁻ (radical anions) along with oxidation of Eu (i.e., the formation of $Eu^+$ or $Eu^{2+}$ or $Eu^{3+}$; Eu cation).

Fourth Embodiment

In the fourth embodiment of the present invention, an organic compound containing alkaline metal ions and simultaneously exhibiting an electron-accepting (-transporting) property by itself, for example, Liq described above, can be used in the formation of the electron transportation section (thermal reduction reaction-generated layer). A suitable ratio of the compound Liq and a thermally reducible metal such as aluminum can be simultaneously deposited and mixed (binary co-deposition) to form the electron transportation section having the functions similar to those of the first to third embodiments. In this co-deposition process, it is assumed that some of Liq may remain without being thermally reduced with aluminum, and they can form a charge transfer complex {$Li^+ \cdot Liq^-$} through the oxidation-reduction reaction as follows:

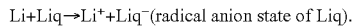

Of course, an inorganic compound may be used in place of this organic metal complex compound, if the inorganic compound is a compound containing ions of the low work function metals such as alkaline metal ions or rare earth metal ions described above.

In the organic devices of the present invention, the hole transportation section is formed in adjacent to the electron transportation section described in the first to fourth embodiments. The hole transportation section of the present invention includes an organic compound having an ionization potential of less than 5.7 eV and an electron-donating property which is widely used in the hole injection layer or the hole transportation layer in the conventional organic EL devices, and an inorganic or organic substance capable of forming a charge transfer complex upon its oxidation-reduction reaction with the organic compound. In the hole transportation section, the organic compound and the inorganic or organic substance are contacted through lamination or by mixing, and the electron-donating organic compound is in a radical cation state.

It is noted in the present invention that the formation of the organic compound, metal, and hole current-electron current conversion layer, as a film or layer was carried out by using a vacuum deposition apparatus commercially available from Vieetech Japan Co., Ltd. Furthermore, the control of the deposition rate of the vapor deposition materials and of the thickness of the deposited layers was carried out by using a thickness monitor with a quartz oscillator "CRTM-8000" of ULVAC Co. attached to the vapor deposition apparatus. To determine an actual layer thickness after the layer formation, a stylus step meter, "P10" of Tencor Co. was used. The characteristics of the devices were evaluated with the source meter "2400" of KEITHLEY Co. and the luminance meter "BM-8" of TOPCON Co. An absorption spectrum was obtained by "Lambda 19" commercially available from Perkinelmer Co., Ltd.

The present invention will be further described with reference to the examples thereof. Note, however, that the present invention is not restricted to these examples.

Example 1

This example is intended to explain one example of the organic EL device according to the present invention in which the hole current-electron current conversion layer of the present invention is disposed adjacent to the cathode, and as a result, the layer contacting the cathode being hole-transporting layer.

As is illustrated in FIG. 1, a glass substrate 10 having applied thereon an anode 11 of the patterned ITO (indium tin oxide) was laminated through vacuum deposition with 4,4'-bi[N-(2-naphtyl)-N-phenyl-amino]biphenyl (hereinafter, referred as "α-NPD" or "NPB") represented by the following formula:

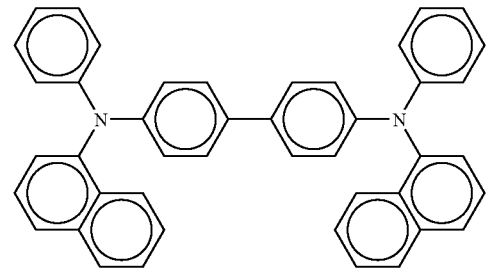

at a thickness of about 600 Å to form a hole transportation layer 12, followed by depositing Alq at about 600 Å to form a light emission layer 13.

Thereafter, the above-described Alq and Liq (low work function metal ion-containing compound) in a molar ratio of 1:1 were co-deposited at a thickness of about 50 Å to form a layer 14. Subsequently, aluminum as a thermally reducible metal was deposited at an amount necessary to obtain a layer thickness of about 15 Å to form a layer 15. Thereafter, α-NPD and vanadium pentoxide ($V_2O_5$) in a molar ratio of 1:1 were deposited at a thickness of about 100 Å to form a layer 16 (hole transportation section). Finally, aluminum was deposited at a thickness of about 1,000 Å to form a cathode electrode 17.

The structure of the resulting organic EL device 210 is simply represented as follows: ITO/αNPD (600 Å)/Alq (600 Å)/Alq:Liq (1:1) (50 Å)/Al (15 Å)/$V_2O_5$:α-NPD (1:1) (1000 Å)/Al (FIG. 1). Note that this simplified notation system will be applied to the explanation of the devices described hereinafter.

Figure 2:
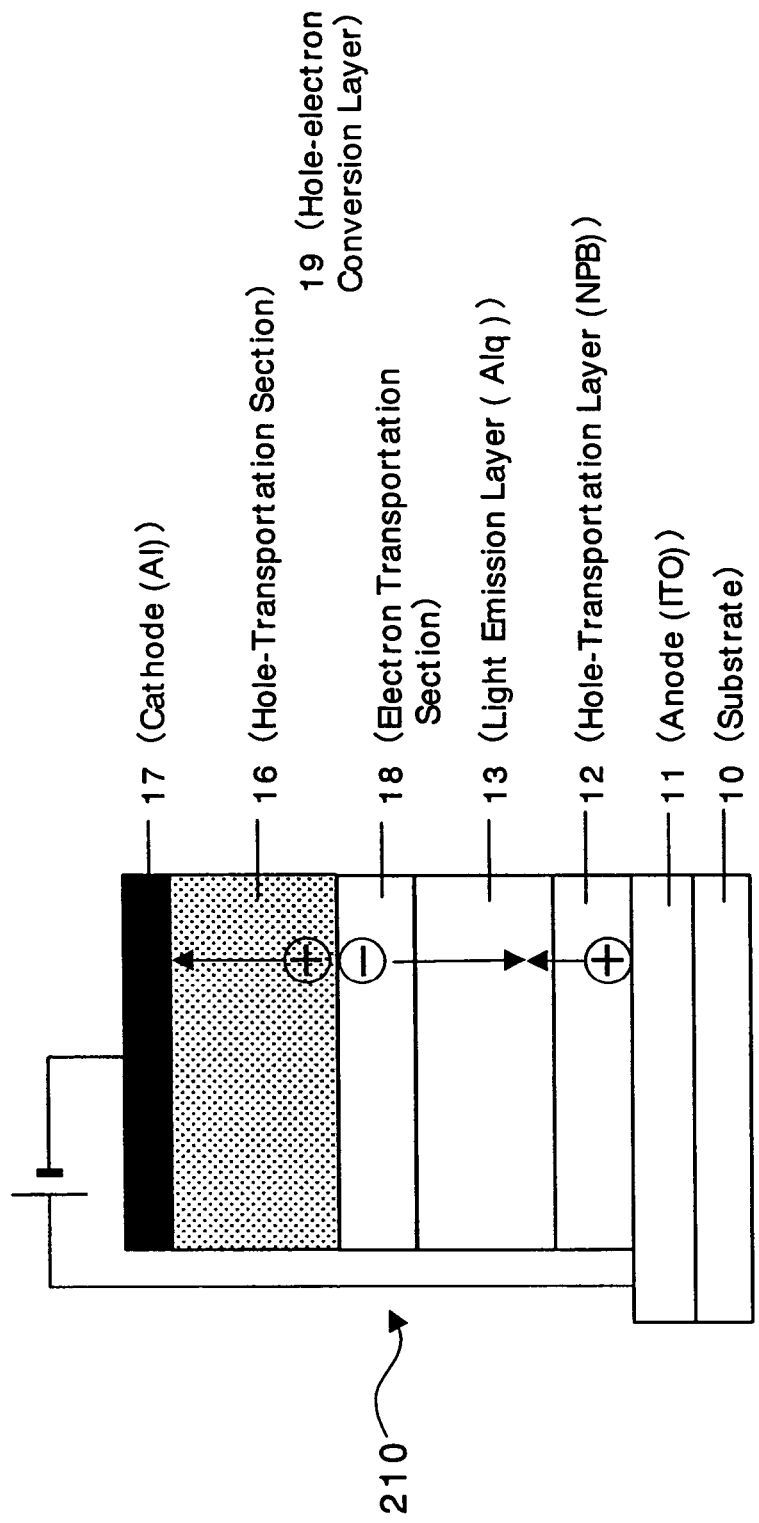
FIG. 2 is a cross-sectional view schematically showing the operation of the organic EL device according to Example 1 of the present invention.
Figure 3:
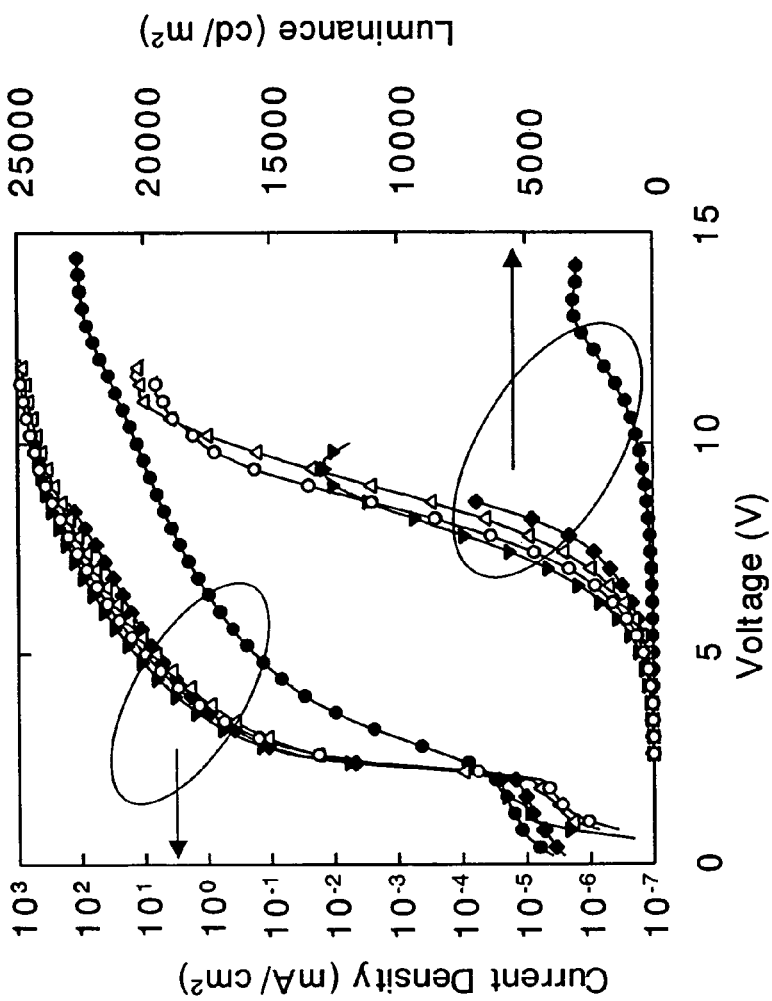
FIG. 3 is a graph showing the characteristic curve of the voltage (V)-current density (mA/cm$^2$)-luminance (cd/m$^2$) with regard to the devices according to Examples 1 to 3, Comparative Example 1 and Reference Example 1.

In the organic EL device 210, a DC voltage was applied to between ITO as the anode electrode and Al as the cathode electrode to obtain FIG. 3 showing the measured results of the characteristics. Referring to FIG. 3, the symbols (○) represent a characteristic curve of voltage (V)-current density ($mA/cm^2$)-luminance ($cd/m^2$) of the resulting device. Moreover, as illustrated in FIG. 2 schematically showing the operation of the resulting device, the layers 14 and 15 can act as an electron transportation section (thermal reduction reaction-generated layer) 18, and the layers 16 and 18 can act as a hole current-electron current conversion layer 19.

Comparative Example 1

Figure 4:
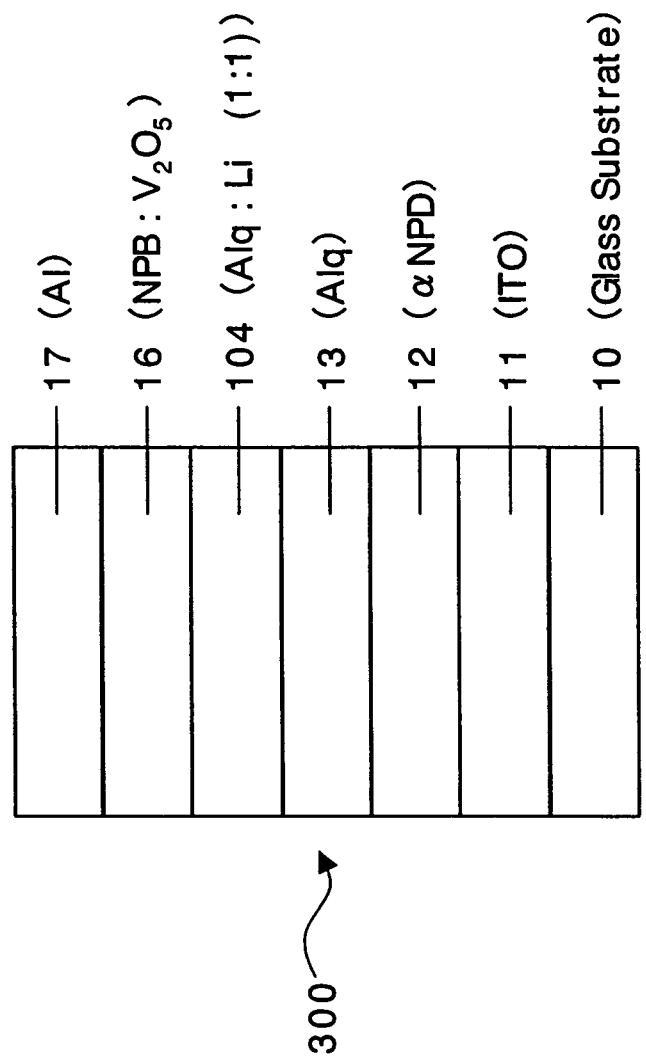
FIG. 4 is a cross-sectional view schematically showing the structure of the organic EL device according to a Comparative Example.

The procedure of Example 1 was repeated with the proviso that for the purpose of comparison, a thermal reduction reaction-generated layer 18 acting as the electron transportation section of the present invention was omitted from the device of Example 1, i.e., Liq of the layer 14 in Example 1 was replaced with the metal Li in the layer 104 as illustrated in FIG. 4. The structure of the resulting organic EL device 300 is represented as follows:

ITO/αNPD(600 Å)/Alq(600 Å)/Alq:Li(1:1)(50 Å)/$V_2O_5$:α-NPD(1:1)(100 Å)/Al (FIG. 4).

The results measured on the characteristics of the device 300 are plotted with the symbols (●) in FIG. 3.

Example 2

Figure 5:
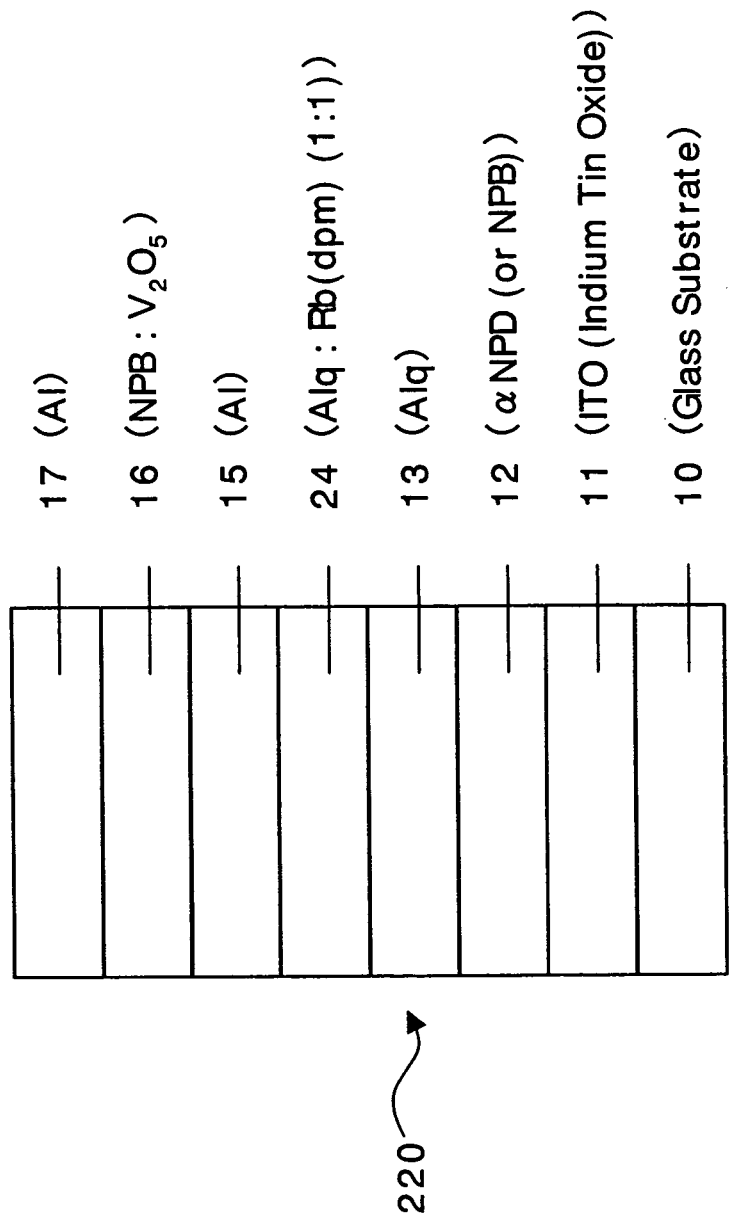
FIG. 5 is a cross-sectional view schematically showing the structure of the organic EL device according to Example 2 of the present invention.

The procedure of Example 1 was repeated with the proviso that Liq of the layer 14 in Example 1 was replaced with a rubidium complex of mono (2,2,6,6-tetramethyl-3,5-heptanedionato)(hereinafter referred as Rb(dpm)) represented by the following formula:

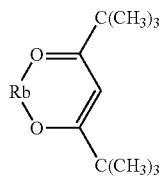

in the layer 24 to form an organic EL device 220 having the structure: ITO/αNPD(600 Å)/Alq(600 Å)/Alq:Rb(dpm)(1:1) (50 Å)/Al(15 Å)/$V_2O_5$:α-NPD(1:1)(100 Å)/Al (FIG. 5). The results measured on the characteristics of the device 220 are plotted with the symbols (▼) in FIG. 3.

Example 3

Figure 6:
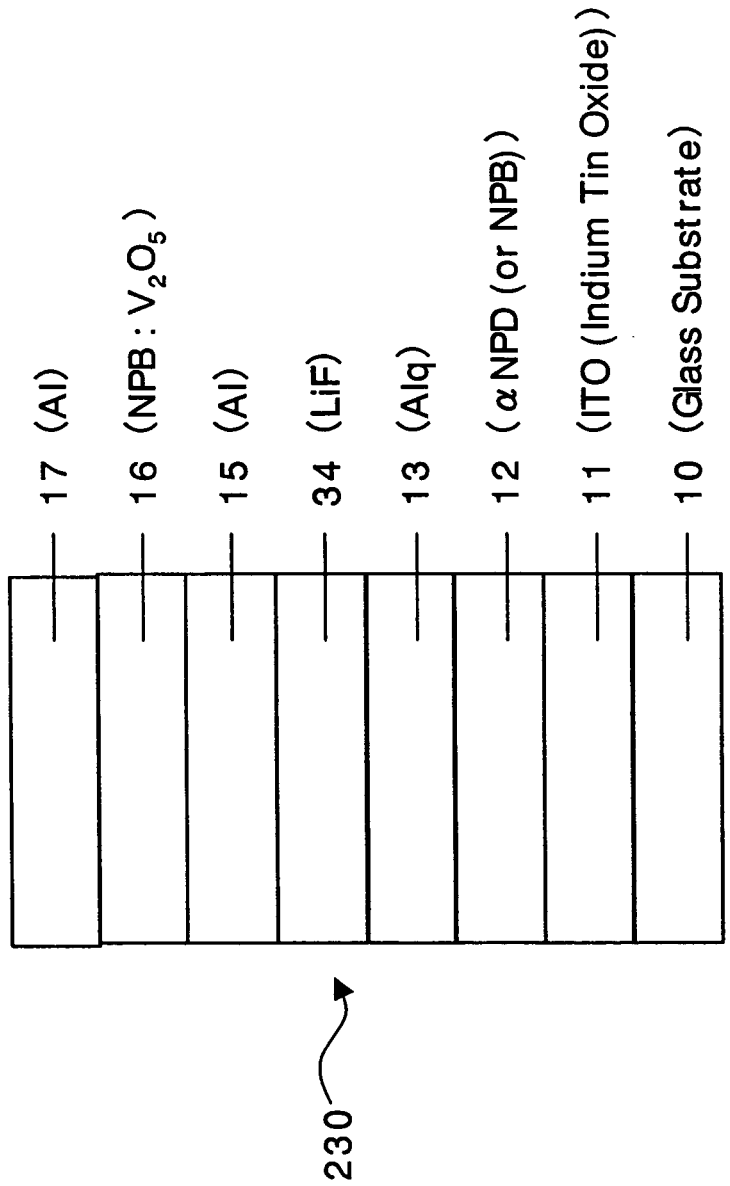
FIG. 6 is a cross-sectional view schematically showing the structure of the organic EL device according to Example 3 of the present invention.

The procedure of Example 1 was repeated with the proviso that Liq of the layer 14 in Example 1 was replaced with an inorganic alkaline metal compound: lithium fluoride (LiF) in the layer 34 to form an organic EL device 230 having the structure: ITO/αNPD(600 Å)/Alq(600 Å)/LiF(10 Å)/Al(15 Å)/$V_2O_5$:α-NPD(1:1)(100 Å)/Al (FIG. 6). As illustrated FIG. 6, in the organic EL device 230, the electron-accepting compound Alq (layer 13) and the alkaline metal compound LiF (layer 34) contact via lamination, not via mixing (i.e., co-deposition). The results measured from the characteristics of the organic EL device 230 are plotted using the symbols (Δ) in FIG. 3.

Reference Example 1

Example of Conventional Organic EL Device

Figure 7:
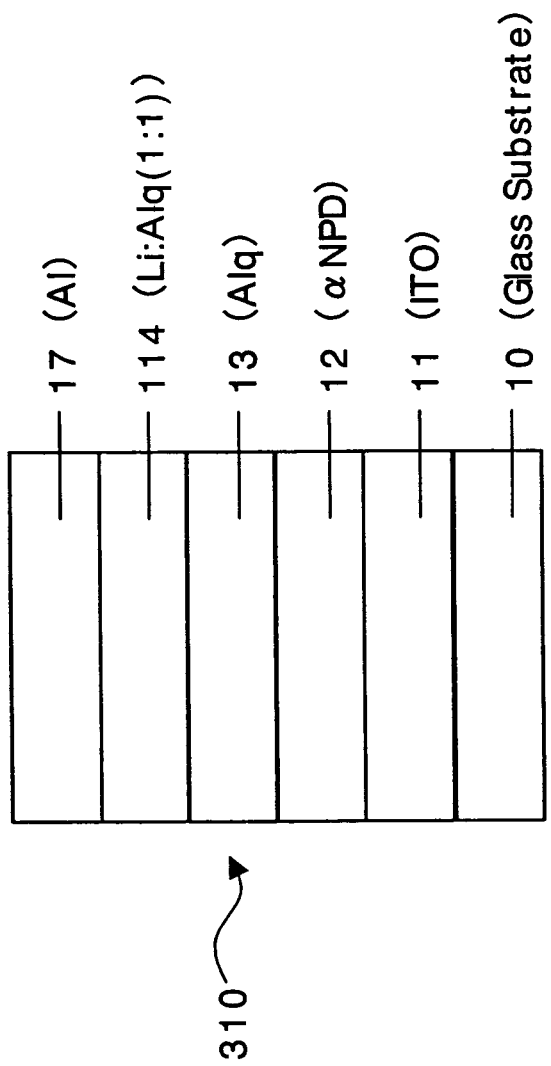
FIG. 7 is a cross-sectional view schematically showing the structure of the organic EL device according to Reference Example 1.

The procedure of Example 1 was repeated with the proviso that for the purpose of reference, the layers 14 through 16 in Example 1 are omitted and replaced with a layer 114 having of Alq:Li(1:1) in the layer 114 to form an organic EL device 310 having the structure:

ITO/αNPD(600 Å)/Alq (600 Å)/Alq:Li (1:1)(50 Å)/Al (FIG. 7).

The results measured on the characteristics of the device 310 are plotted with the symbols (♦) in FIG. 3.

Upon comparing the results of Examples 1 through 3 to those of Comparative Example 1 and Reference Example 1, it was confirmed that organic EL devices having the hole current-electron current conversion layer of the present invention can exhibit the functions comparable to those of conventional organic EL devices, and can be operated at a lower voltage than conventional organic EL devices. Furthermore, it was confirmed that if a reducing dopant such as alkaline metals is in the hole current-electron current conversion layer, an energy barrier can be formed within the conversion layer, and thus the voltage required to obtain the same current density or the same luminance is raised compared to above examples of the present invention.

Example 4

The purpose of Example 4 is to carry out experiments for confirming the role of the thermally reducible metal and determining the best deposition amount (or corresponding best deposition thickness) of the same metal. The organic EL device produced in Example 1 was used as the standard structure, and a deposition amount of the aluminum as the thermally reducible metal was varied to ascertain a variation of the characteristics caused with the variation of the deposition amount. Namely, the organic EL devices having the structure:

ITO/αNPD (600 Å)/Alq (600 Å)/Alq:Liq (1:1) (50 Å)/Al (XÅ)/$V_2O_5$:α-NPD (1:1) (100 Å)/Al were produced with variation of the thickness (XÅ) of the Al layer 15.

Figure 8:
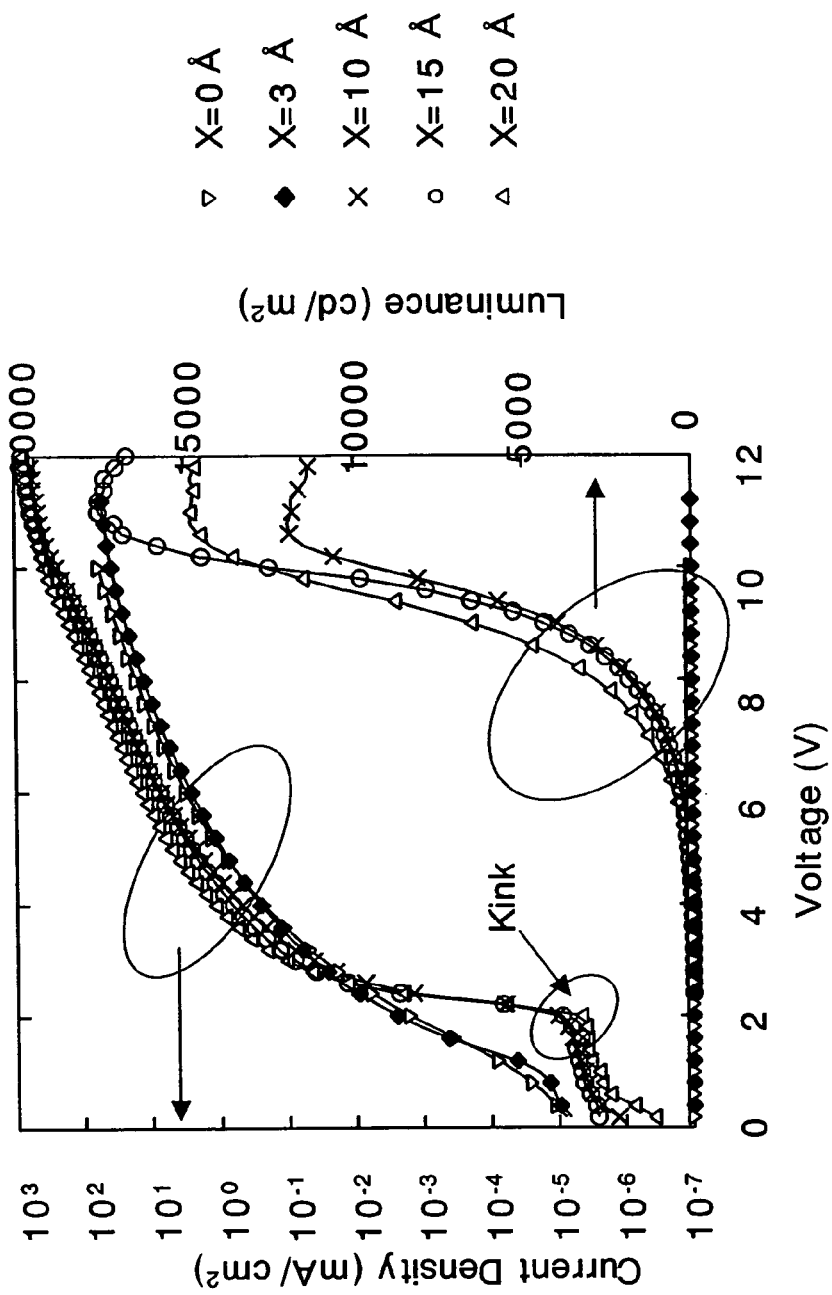
FIG. 8 is a graph showing the characteristic curve of the voltage (V)-current density (mA/cm$^2$)-luminance (cd/m$^2$) with a variation of a thickness X (Å) of the aluminum layer, with regard to the organic EL device of Example 1 of the present invention as a standard structure.
Figure 9:
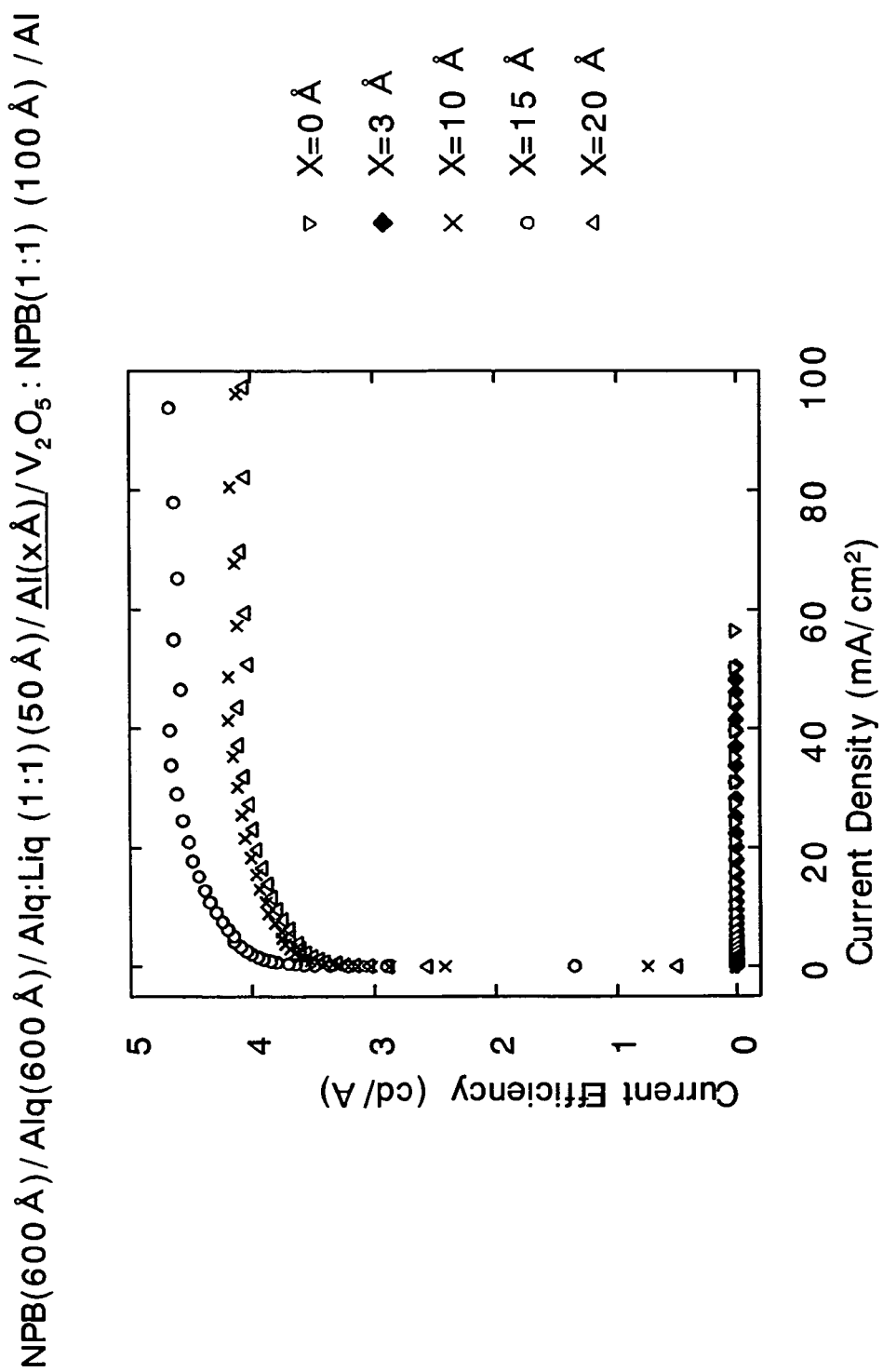
FIG. 9 is a graph showing the characteristic curve of the current density (mA/cm$^2$)-current efficiency (cd/A) with variation of a thickness X (Å) of the aluminum layer, with regard to the organic EL device of Example 1 of the present invention as a standard structure.

The results are plotted in FIGS. 8 and 9 in which FIG. 8 shows the characteristic curve of the voltage (V)-current density (mA/cm²)-luminance (cd/m²), and FIG. 9 shows the characteristic curve of the current density (mA/cm²)-current efficiency (cd/A). In these plotted results, the symbols (∇) represent the results obtained with X=0 Å (i.e., without deposition of aluminum) in the organic EL device, the symbols (♦) the results with X=3 Å, the symbols (X) the results with X=10 Å, the symbols (○) the results with X=15 Å and the symbols (Δ) the results with X=20 Å, respectively.

It was appreciated from the above results that no light emission is observed if the deposition amount of the thermally reducible metal is lower than the appropriate amount (corresponding to experiments in which X=0 Å and X=3 Å). This is because no radical anion molecule of the electron-accepting organic compound is produced in the thermal reduction reaction-generated layer, and thus no electron is injected into the light emission layer. Accordingly, the electric current observed in these experiments is hole-only current, and this is evidenced with the fact that no "kink" is observed at a turn on voltage of about 2.2V, while the kink is clearly seen at the turn on voltage if light can be generated from the devices (as shown in FIG. 8).

In addition, it was appreciated from the graphs of FIGS. 8 and 9 that within the scope of the present experiments, the luminance and the efficiency can be improved to the best level if a deposition amount of aluminum is adjusted to that corresponding to the layer thickness of 15 Å. Moreover, it was appreciated that if the deposition amount of aluminum is increased beyond 15 Å, there remains a metal aluminum which cannot contribute to the thermal reduction reaction (i.e., cannot be converted to an oxidized state), thereby causing deterioration of the characteristics of the organic EL devices.

Example 5

This example is intended to explain one example of simultaneous deposition (ternary co-deposition) of a low work function meal ion-containing compound, an electron-accepting organic compound and a thermally reducible metal to give both good transparency and good (low) conductivity to the organic EL device. After preparation of each of a glass substrate having applied thereon a patterned layer of aluminum and a quartz substrate for use in the determination of an absorbance, the layer formation was carried out by vapor deposition in accordance with the following procedure.

Figure 10:
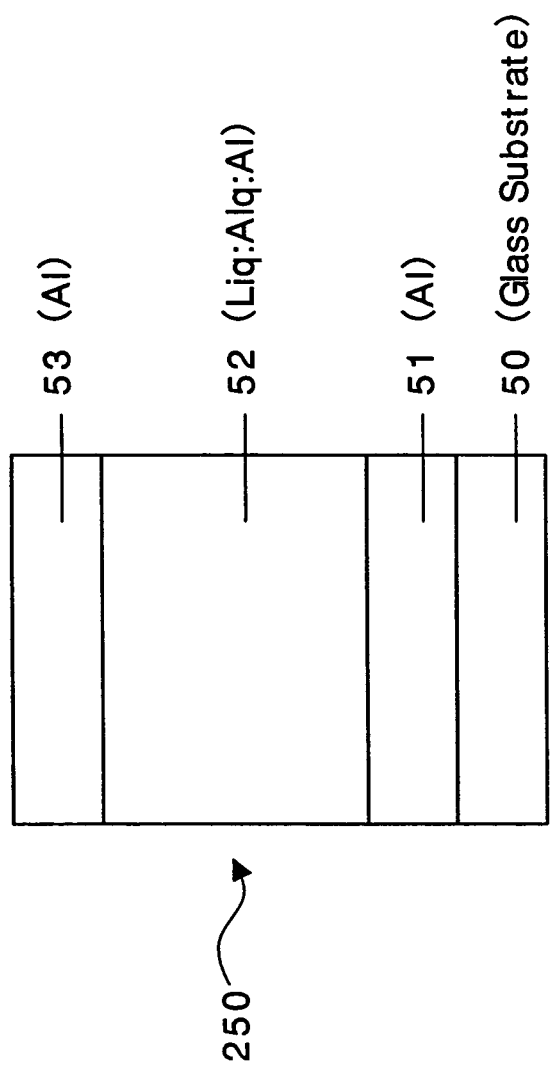
FIG. 10 is a cross-sectional view schematically showing the structure of the organic. EL device according to Example 5 of the present invention.

As is illustrated in FIG. 10, a glass substrate 50 with the patterned aluminum layer (Al electrode) 51 was co-deposited with Liq as an organic metal complex compound containing an ion of a low work function metal, Alq as an electron-accepting organic compound and Al(aluminum) as a thermally reducible metal at a ratio of the deposition rate of Liq:Alq:Al=1 Å/s(Liq):3 Å/s(Alq):0.3 Å/s(Al) to form a layer 52, followed by forming an Al electrode 53, to form a test device 250 having the structure: glass/Al/Liq:Alq:Al/Al (FIG. 10).

The comparative EL devices were produced as follows.

Figure 11:
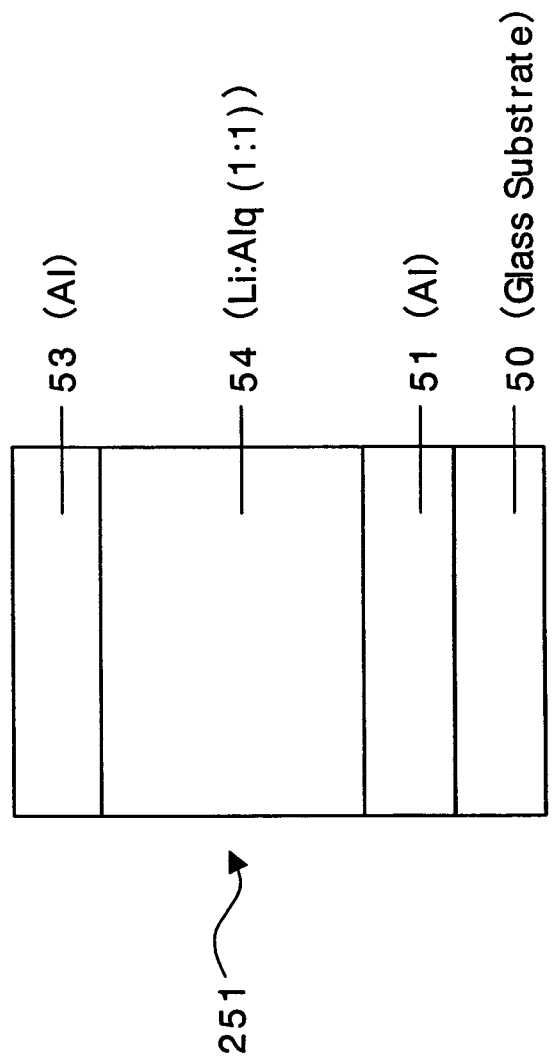
FIG. 11 is a cross-sectional view schematically showing the structure of an organic EL device as a comparative device which is comparable to the organic EL device according to Example 5 of the present invention.

The above procedure was repeated with the proviso that as is illustrated in FIG. 11, the layer 52 was omitted and was replaced with a layer 54 produced by directly mixing Li as an alkaline metal and an electron-accepting organic compound (Alq). The structure of the resulting test device 251 had the structure: glass/Al/Alq:Li (1:1; molar ratio)/Al (FIG. 11).

Figure 12:
FIG. 12 is a cross-sectional view schematically showing the structure of the organic EL device as another comparative device, which is comparable to the organic EL device according to Example 5 of the present invention.

The above procedure was repeated with the proviso that, as is illustrated in FIG. 12, the layer 52 was omitted and was replaced with a sole layer 55 consisting of Alq. The structure of the resulting test device 252 has the structure: glass/Al/Alq/Al (FIG. 12).

Figure 15:
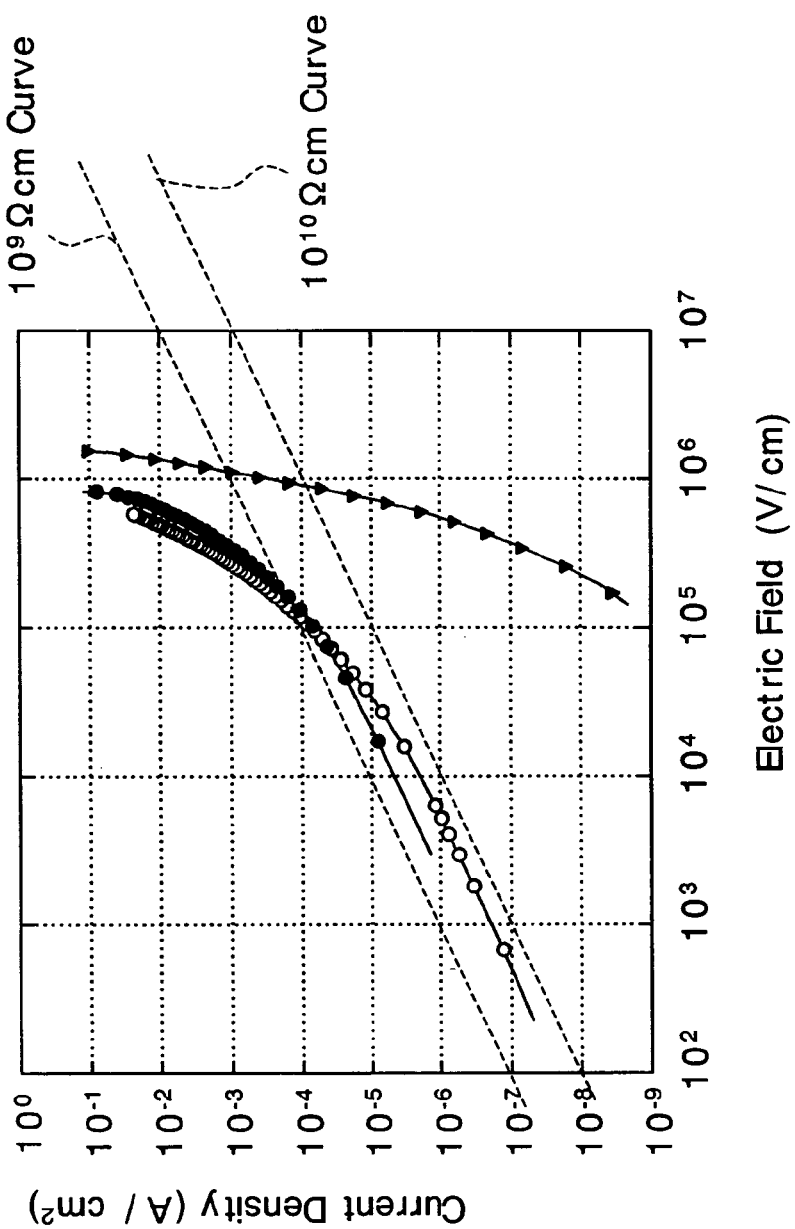
FIG. 15 is a graph showing the characteristic curve of the electric field (V/cm)-current density (A/cm$^2$) with regard to the devices according to Example 5 of the present invention and the comparative devices.

The results plotted in FIG. 15 shows the characteristic curve of the electric field (V/cm)-current density (A/cm$^2$) measured on each of the test device of 250 and the comparative organic EL devices 251 and 252.

As is shown in the graph of FIG. 15, it is appreciated that the test device having the structure: glass/Al/Liq:Alq:Al/Al (FIG. 10) and the test device having the structure: glass/Al/Alq:Li (1:1; molar ratio)/Al (FIG. 11) both have the substantially same characteristics and show a resistivity of ~10$^9$ Ωcm. These results mean that Li ions in the Liq were subjected to the thermal reduction reaction through Al deposition to the Li metal, and the Li metal produced upon the thermal reduction reaction was subjected to the donating and accepting of electrons via the electron-accepting organic compound (Alq), i.e., oxidation-reduction reaction to form a charge transfer complex (Li++Alq$^-$, (radical anions of Alq)).

Figure 13:
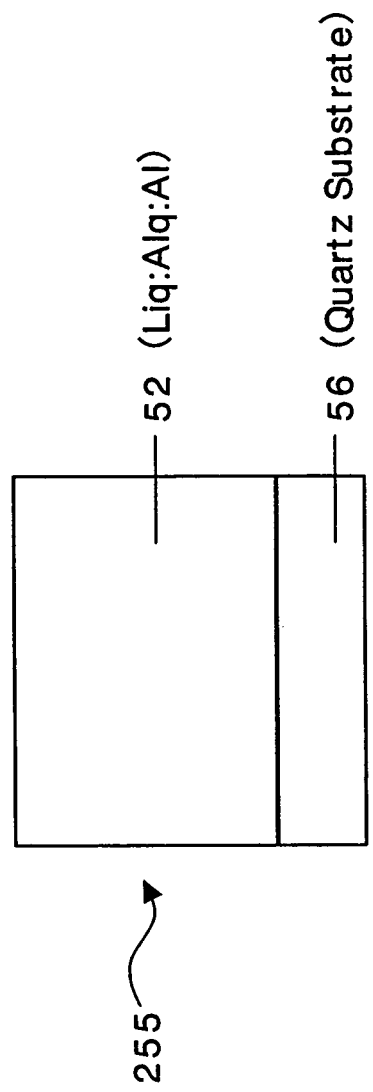
FIG. 13 is a cross-sectional view schematically showing the structure of the test device for use in the determination of an absorbance.
Figure 14:
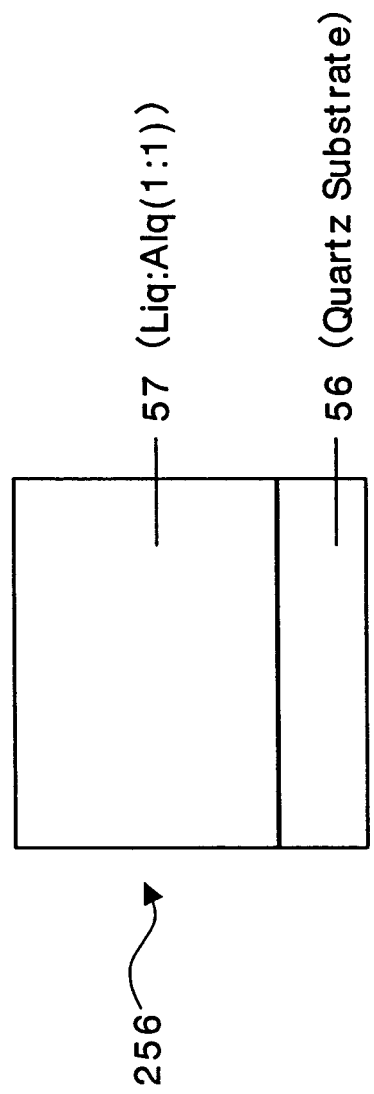
FIG. 14 is a cross-sectional view schematically showing the structure of a comparative test device.

To produce a test device for use in the determination of an absorbance, as is illustrated in FIG. 13, a quartz substrate 56 was co-deposited with Liq, Alq and Al at a ratio of the deposition rate of Liq:Alq:Al=1 Å/s(Liq):3 Å/s(Alq):0.3 Å/s(Al) to form a layer 52. The resulting test device 255 had the structure: quartz substrate/Liq:Alq:Al(FIG. 13). To produce a comparative test device, the above procedure was repeated with the proviso that, as illustrated in FIG. 14, a quartz substrate 56 was co-deposited with Liq and Alq without mixing the thermally reducible metal (Al) to form a layer 57. The resulting comparative test device 256 had the structure: quartz substrate/Liq:Alq (FIG. 14).

Figure 16:
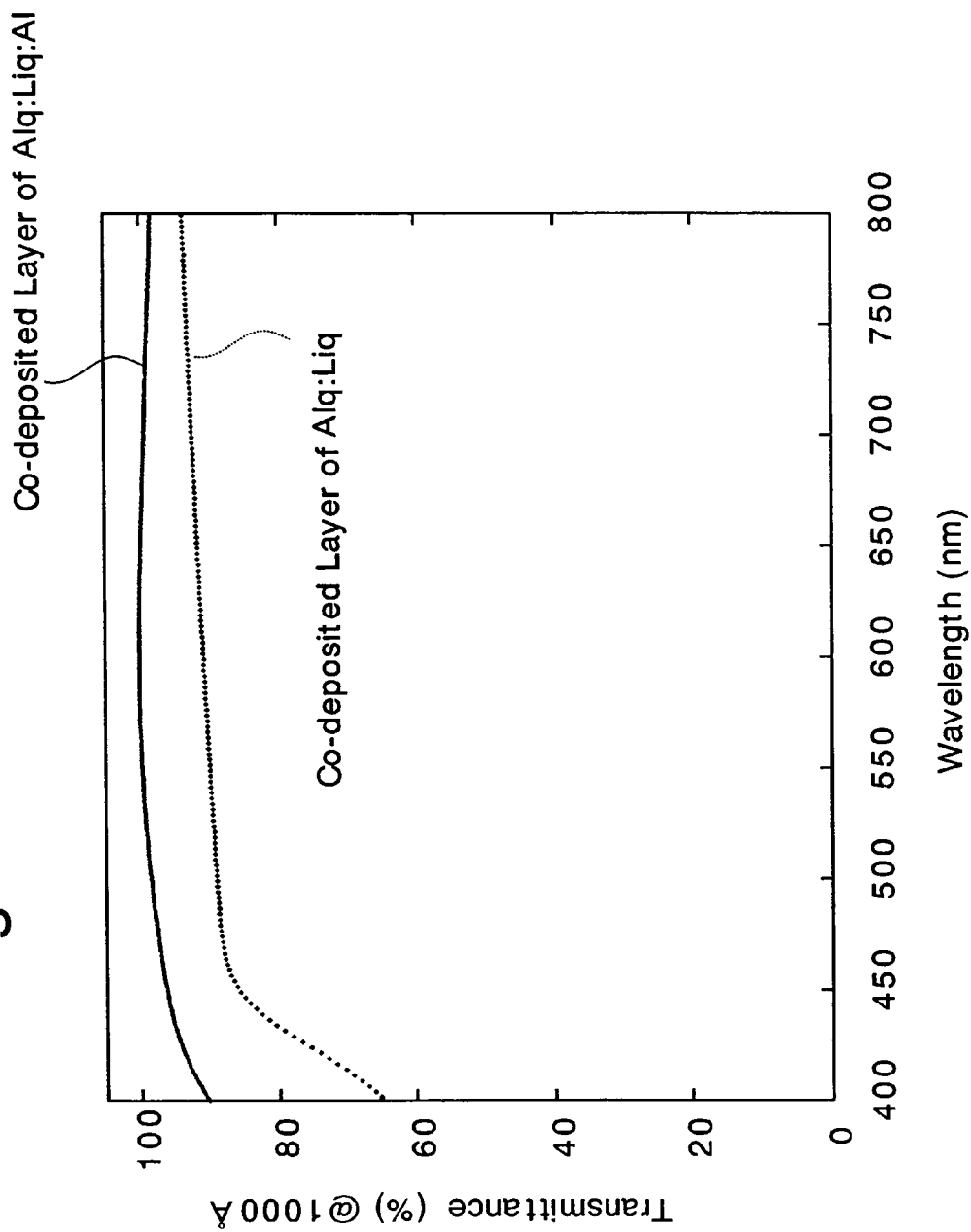
FIG. 16 is a graph showing the characteristic curve of the wavelength (nm)-transmittance (%) with regard to the test device for use in the determination of an absorbance and the comparative test device.
Figure 17:
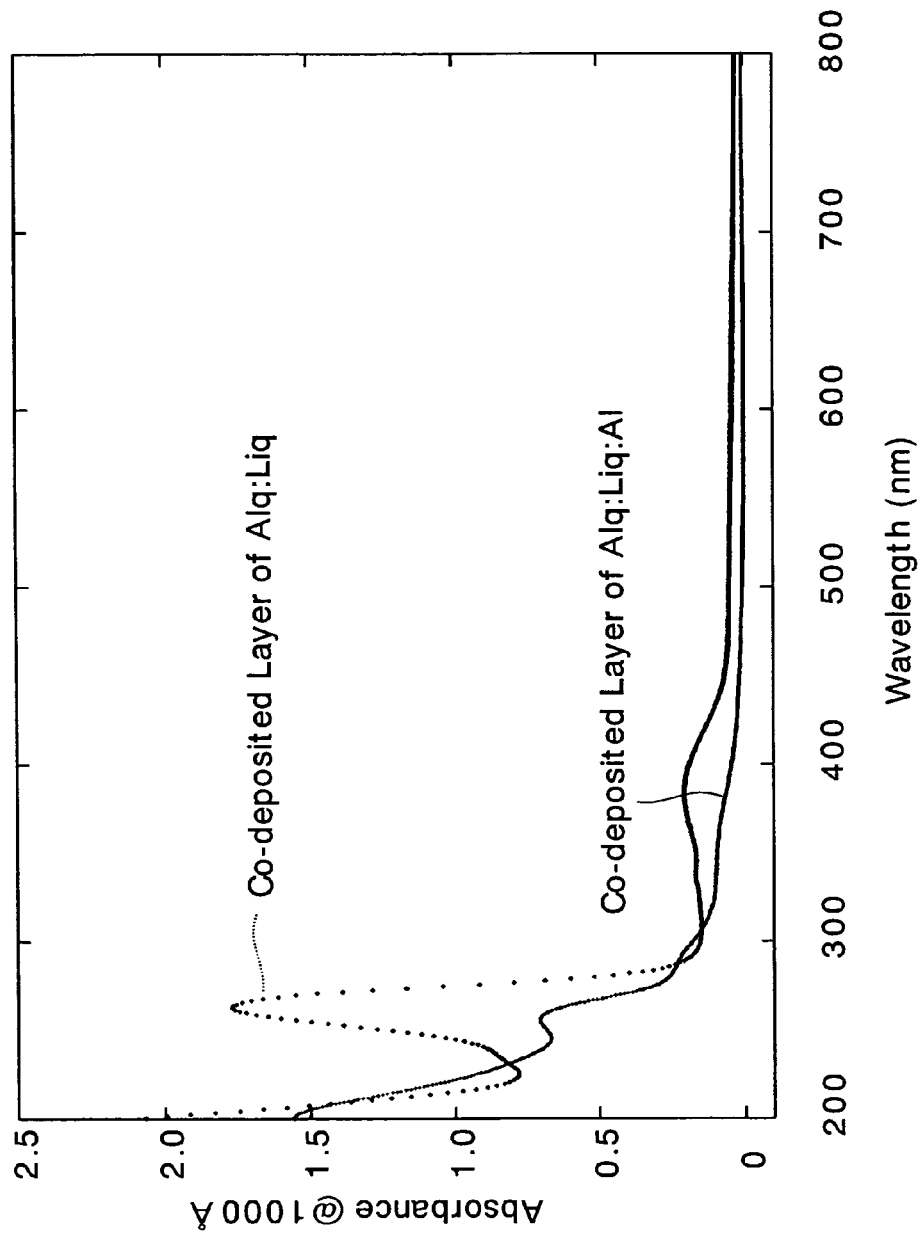
FIG. 17 is a graph showing the characteristic curve of the wavelength (nm)-absorbance with regard to the test device for use in the determination of an absorbance and the comparative test device.

The results plotted in FIG. 16 shows the characteristic curve of the wavelength (nm)-transmittance (%) measured on each of the test device 255 having the Liq:Alq:Al layer 52 at 1,000 Å and the comparative test device 256 having the Liq:Alq layer 57 at 1,000 Å. As shown in the graph of FIG. 16, it was appreciated that, under the same layer thickness of 1,000 Å, the mixed layer 52 consisting of Liq:Alq:Al which is the electron transportation section of the present invention can exhibit a remarkably increased transmittance in comparison with the layer 57 consisting only of the organic compounds (Liq:Alq). Furthermore, it is noted here that the inventor of this application has reported a variation of the absorption spectrum observed in the lithium metal-doped layer in the above-cited article, Appl. Phys. Lett., Vol. 73, p. 2866 (1998). Comparing the observation in this article with the results of FIG. 17, a change of the absorption spectrum of the test device according to the present invention having the structure: quartz substrate/Liq:Alq:Al (FIG. 13) from that of the comparative test device having the structure: quartz substrate/Liq:Alq (FIG. 14) are very similar to the change of the absorption spectrum reported in the above article. Moreover, it was appreciated that the test device of the present case, though containing a metal aluminum added during the formation of the layer 52, shows an improved transparency. Accordingly, in the present invention, a charge transfer complex is formed along with the above-described thermal reduction reaction and the subsequent oxidation-reduction reaction.

Example 6

This example describes the application of the organic device of the present invention to a formation of an anti-reflection layer.

Copper phthalocyanine (hereinafter referred to as "CuPc") represented by the following formula:

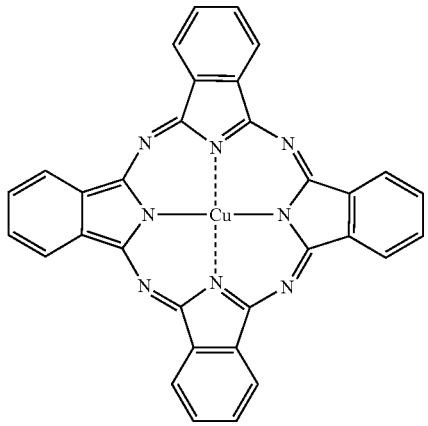

and quinacridone pigments which are coloring pigments and are well-known to have a hole transportation ability, since they exhibit a strong absorption in a red region and a blue region, respectively, of the visible area of the spectrum, can be used in combination with the "hole current-electron current conversion layer" of the present invention to form an anti-reflection layer, thereby providing an organic EL device having a high contrast ratio.

Figure 18:
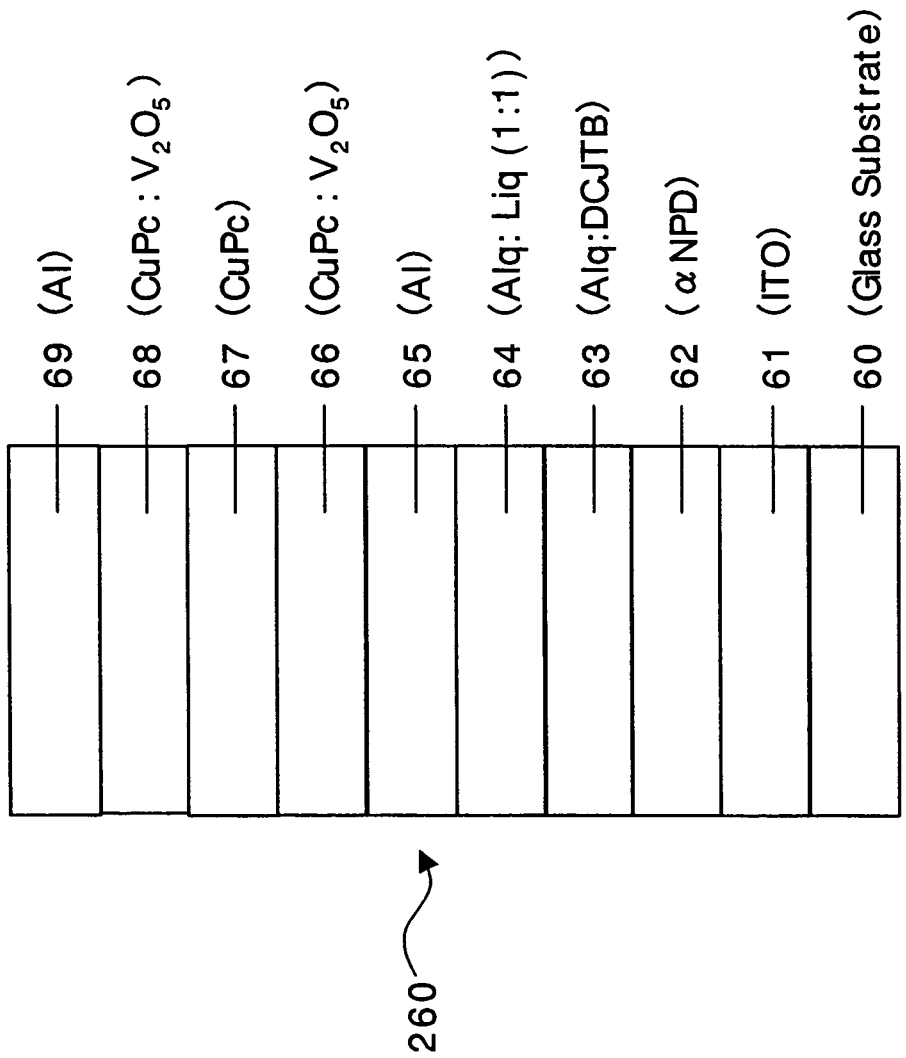
FIG. 18 is a cross-sectional view schematically showing the structure of the organic EL device according to Example 6 of the present invention.

As is illustrated in FIG. 18, a glass substrate 60 is deposited with an ITO layer 61, an αNPD layer 62 and a red light emission layer 63 (DCJTB:Alq) in that order to form an organic EL device structure. Thereafter, a layer 64 consisting of Alq:Liq (1:1), a layer 65 consisting of Al and a layer 66 consisting of V$_2$O$_5$:CuPc are deposited over the resulting organic EL device structure in that order to form a hole current-electron current conversion layer, over which a layer 67 of CuPc is further deposited. Furthermore, a layer 68 of CuPc: V$_2$O$_5$ and a layer (cathode) 69 of Al are deposited in this order over the CuPc layer 67. The resulting organic EL device 260 has the structure: ITO/αNPD/DCJTB:Alq/Alq:Liq (1:1)(50 Å)/Al(15 Å)/V$_2$O$_5$:CuPc/CuPc/V$_2$O$_5$:CuPc/Al (FIG. 18).

According to the method described in this example, the organic EL device 260 having a high contrast ratio can be produced, because a portion of the red lights generated in the light emission layer 63 consisting of DCJTB:Alq which is transmitted in the direction of an Al cathode 69 can be absorbed by controlling a layer thickness of the layers (CuPc/ $V_2O_5$:CuPc).

In addition, when the pigments used have a hole transportation property and a light absorption ability in the specific wavelength region as in quinacridone pigments or derivatives thereof described in "39th lecture meeting, Associate of Society of Applied Physics, Preprint 28p-Q-9, p. 1036 (1992)", or indanthrene pigments described in Japanese Patent Application Laid-open No. 2000-58267, such pigments can be suitably used alone or by lamination or mixing, while utilizing the device structure of the present invention, to form a hole current layer (hole transportation section) contacting the light-reflecting cathode.

Since substantially all of the organic molecules of such pigment type have a hole transportation property, they cannot be of course used when an electron transportation substance is indispensable as a layer contacting the cathode as in the conventional organic EL devices (having no hole-electron current conversion layer).

Example 7

Example 7 describes the application of an organic device of the present invention to a formation of a damage reduction layer during a layer formation process with high energy particles.

It is known in the field of organic EL devices that the high energy particle deposition method such as electron beam deposition or sputtering deposition can be used in the formation of cathodes. Further, the inventor has disclosed in Japanese Patent Application Laid-open No. 2002-332567 (Japanese Patent Appln. No. 2001-142672) that electrons can be easily injected from a cathode of organic EL device, even when using the ITO having a high work function as an electron injection cathode, if the above-described metal doping layer is used as an electron injection layer (contacting the cathode). The sputtering apparatus used in the method of JPP'729 had an idea for preventing damaging in the organic layers during sputtering, however, some damages were still observed in the organic layers.

Furthermore, Japanese Patent Application Laid-open Nos. 2000-58265 and 2000-68063 teach an idea for forming a layer of copper phthalocyanine (CuPc) as a buffer layer for sputtering process over the light emission layer. In these JPPs, it is disclosed that when the alkaline metal such as Li is deposited over the thinly formed CuPc layer, the Li metal is diffused into the CuPc layer to across in the direction of the light emission layer, and in such a case, as a result, CuPc can act as an electron-transporting molecules (not acting as a hole-transporting molecules).

However, since CuPc is essentially a hole-transporting molecule in nature, there arises a problem with accelerated deterioration of the organic device when CuPc is used in the formation of the electron transportation layer as is suggested above.

Figure 19:
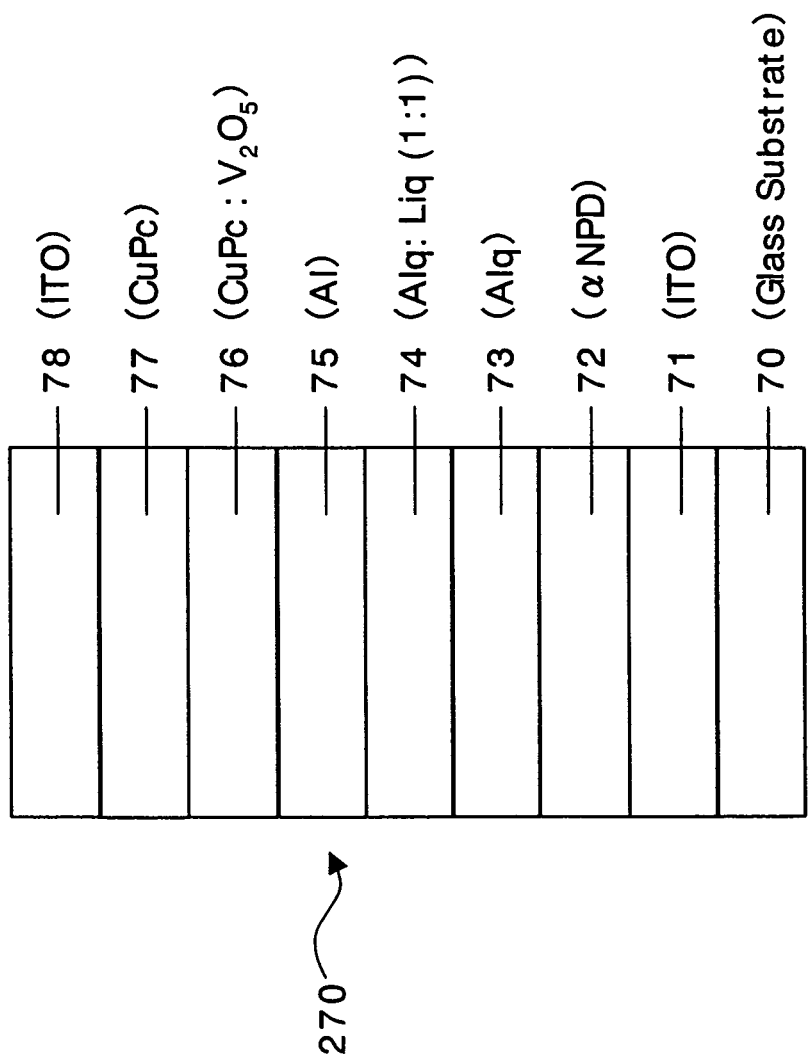
FIG. 19 is a cross-sectional view schematically showing the structure of the organic EL device according to Example 7 of the present invention.

On the other hand, if the hole current-electron current conversion layer of the present invention is used in the formation of the organic device, CuPc used as a buffer layer during the high energy particle deposition such as sputtering can act as a hole transportation layer as it always has been in the past, i.e., CuPc can exhibit its original property. For example, as illustrated in FIG. 19, a glass substrate 70 can be deposited with an ITO layer 71, an αNPD layer 72, a Alq layer 73, a layer 74 of Alq:Liq (1:1), a layer 75 of Al, a layer 76 of $V_2O_5$:CuPc, a layer 77 of CuPc and a cathode 78 consisting of Al, ITO or other material in that order to form an organic EL device 270 having the structure: ITO/αNPD/Alq/Alq:Liq(1: 1),50 Å/Al, 15 Å/$V_2O_5$:CuPc/CuPc/cathode (Al, ITO etc (FIG. 19).

Figure 20:
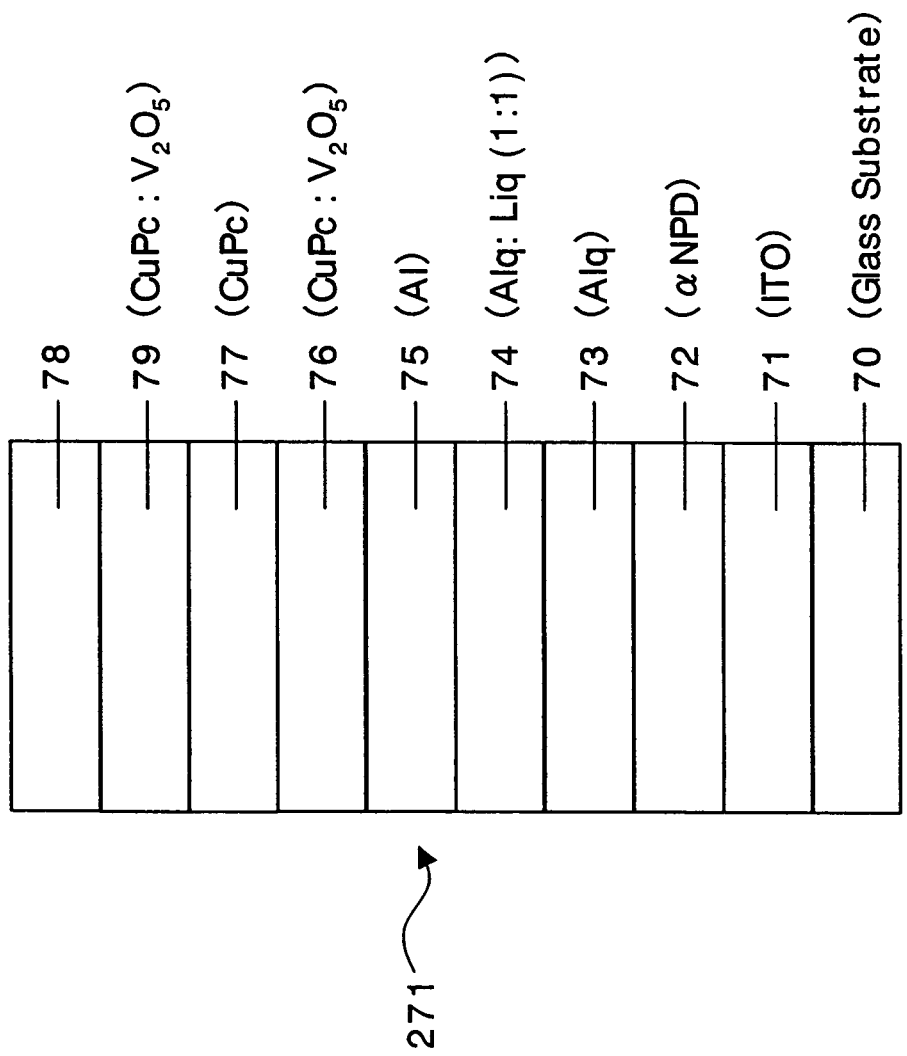
FIG. 20 is a cross-sectional view schematically showing the structure of the organic EL device according to Example 7 of the present invention.

Alternatively, as illustrated in FIG. 20, the CuPc layer 77 of the organic device of FIG. 19 may be replaced with a combination of the CuPc layer 77 and the overlying $V_2O_5$:CuPc layer 79 to form an organic EL device 271 having the structure: ITO/αNPD/Alq/Alq:Liq (1:1),50 Å/Al, 15 Å/$V_2O_5$: CuPc/CuPc/$V_2O_5$:CuPc/cathode(Al, ITO etc (FIG. 20).

In the resulting organic EL devices 270 and 271, the original function as a hole transportation layer and the function as a damage reduction layer to prevent damage due to the high energy particles can be simultaneously accomplished.

Example 8

Example 8 describes an application of an organic device of the present invention to a formation of organic solar cells.

The organic solar cells have the structure similar to that of the organic EL devices, and particularly, as is well-known, the organic solar cells of the two layer type can generate charges in an interface between the hole-transporting molecules and the electron-transporting molecules upon incidence of lights.

For example, typical examples of the organic solar cells are described in the following references:
1) Appl. Phys. Lett., 48, 183 (1986)
2) Chemistry Letters, pp. 327-330 (1990)
3) Appl. Phys. Lett., 76, 2650(2000)
4) Appl. Phys. Lett., 79, 126(2001)
5) Appl. Phys. Lett., 80, 1667(2002)

In particular, references 2 and 5 describe the cell structure in which a plurality (two or more) of a section (charge generation unit) that used to be sandwiched between the both electrodes in the conventional organic solar cells is connected in series. For example, Reference 5 describes the solar cell having the structure: ITO/CuPc/PTCBI/Ag/CuPc/PTCBI/Ag using silver (Ag) at a remarkably reduced thickness of 5 Å in which two charge generation units (CuPc/PTCBI) are connected in series.

The hole current-electron current conversion layer of the present invention can be used in place of the remarkably thinned Ag layer in the above-described solar cell. Namely, according to the present invention, there is provided an organic solar cell having the structure: ITO/CuPc/PTCBI/co-deposited layer of PTCBI:Rb(DPM):Al/co-deposited layer of $V_2O_5$:CuPc/CuPc/PTCBI/Ag. The resulting layer has a high transparency, and can exhibit a lower resistivity in comparison with a pure organic layer. Furthermore, since two charge generation units can be connected in series, an open circuit voltage of the cell can be increased to approximately two times. The above-described structure of the co-deposited layer of PTCBI:Rb(DPM):Al/co-deposited layer of $V_2O_5$: CuPc can act as the hole current-electron current conversion layer of the present invention.

Alternatively, two or more charge generation units may be connected in series by employing the structure of conventional and known charge generation units without any change. For example, as in the structure of ITO/an organic electron-donating (hole-transporting) compound such as arylamine compound: $V_2O_5$ or $F_4$-TCNQ or PNB or others/CuPc/ PTCBI/a thermal reduction reaction-generated layer consisting of an organic electron-accepting (-transporting) compound: a low work function metal ion-containing compound:

a thermally reducible metal/a co-deposited layer of an organic electron-donating (hole-transporting) compound such as arylamine compound: $V_2O_5$ or $F_4$-TCNQ or PNB or others/CuPc/PTCBI/a thermal reduction reaction-generated layer consisting of an organic electron-accepting (-transporting) compound: a low work function metal ion-containing compound: a thermally reducible metal.

In the above device structure, the arylamine compound is represented by the following formula:

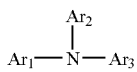

in which $Ar_1$, $Ar_2$ and $Ar_3$ each independently represents an aromatic hydrocarbon group which may have substituent independently.

The structure itself of the charge generation unit is not a matter of the present invention, and thus known structures or novel suitable structures of the charge generation unit may be suitably used instead. Furthermore, it is noted that Japanese Patent Application Laid-open No. 2003-264085 discloses the device having the structure: ITO/CuPc/PV/a co-deposited layer of CuPc:PV/CuPc/PV/Au which is similar to that of the present invention and is produced using the structure of the charge generation unit described in reference 1. It may be assumed from the description of JPP'085 that the device with the above structure can increase the open circuit voltage to two times, however, the study by the inventors of this application has revealed that such an increase of the open circuit voltage cannot be obtained in the above-described organic device, and in fact the voltage of the device generated is rather lower than that obtained with the organic device having only one charge generation unit.

It is believed that the above description of JPP'085 was erroneously described due to the wrong expectation that the different functions which are distinguished from each other with regard to a phenomenon, for example, "function of charge generation at light incidence" and "generation of conductivity (upon formation of a charge transfer complex)", can be created even if a combination of the same materials is used, if different embodiments are applied to the layer formation, such as a difference in the laminated layer structure (CuPc/PV) and the mixed layer structure (co-deposited layer of CuPc:PV). However, in practice, the expected functions cannot be obtained in the absence of the function the hole current-electron current conversion layer of the present invention possesses.

Example 9

Example 9 describes an application of an organic device of the present invention to the formation of organic EL transistors.

Organic EL transistors having the longitudinal FET (Field Effect Transistor) structure, called SIT (Static Induction Transistor), are well-known (cf. 47th lecture meeting, Associate of Society of Applied Physics and others, Preprint 30a-H-2, p. 1297 and 63rd lecture meeting, Associate of Society of Applied Physics and others, Preprint 26p-ZH-15, p. 1161).

Figure 21:
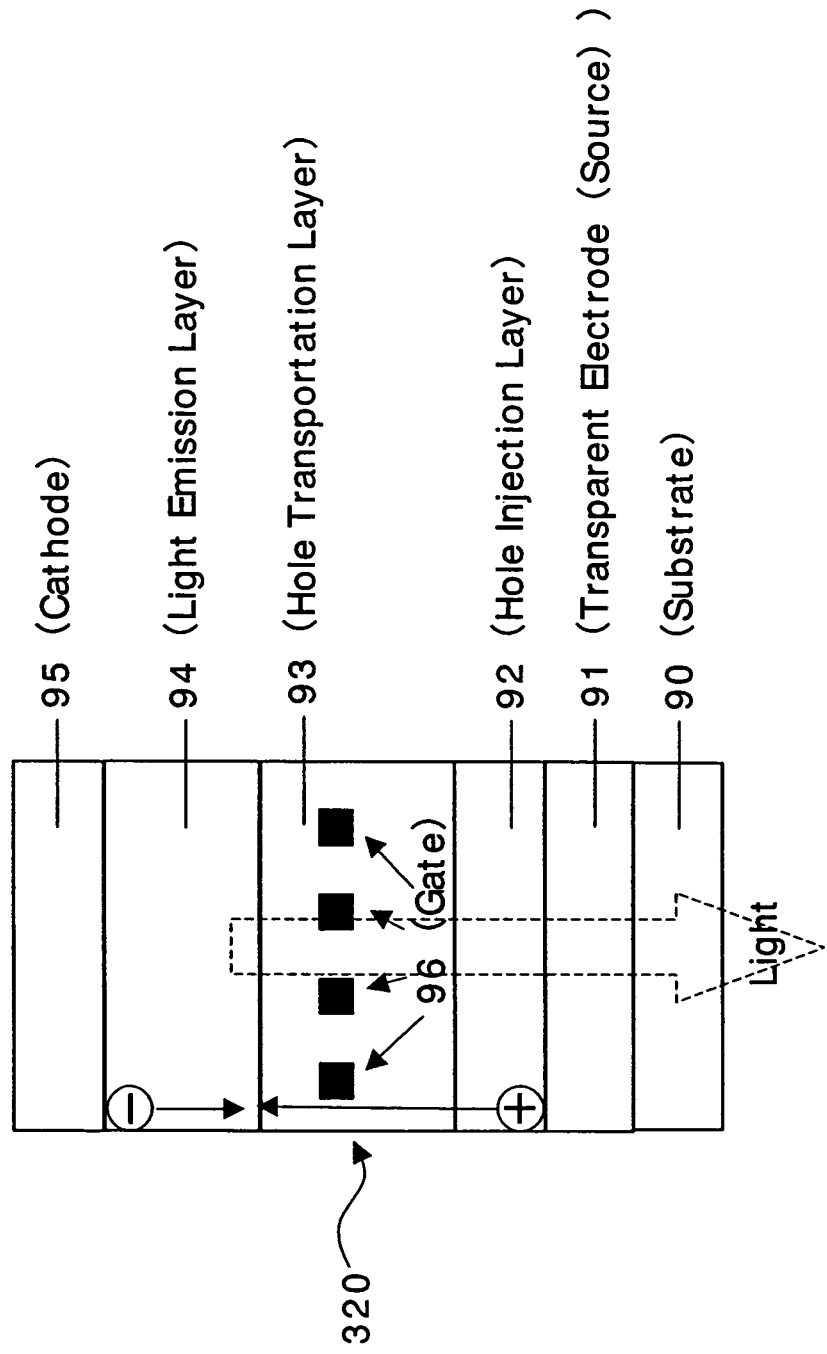
FIG. 21 is a cross-sectional view schematically showing the structure of the prior art organic EL device having a FET structure.

One example of such organic EL transistors includes an organic device 320 of FIG. 21, in which the organic EL device 320 includes a substrate 90 having applied thereon, in sequence, a transparent electrode (source) 91, a hole injection layer 92, a hole transportation layer 93, a light emission layer 94 and a cathode (drain) 95, and a section of the hole transportation layer 93 has embedded therein slit-like gate electrodes (G) 96. The light emission threshold voltage and the emission intensity can be controlled by a variable voltage applied to the gate electrode in the device. However, as illustrated in FIG. 21, the progress of light is prevented and a distance between the slits in the gate electrode cannot be easily optimized.

Figure 22:
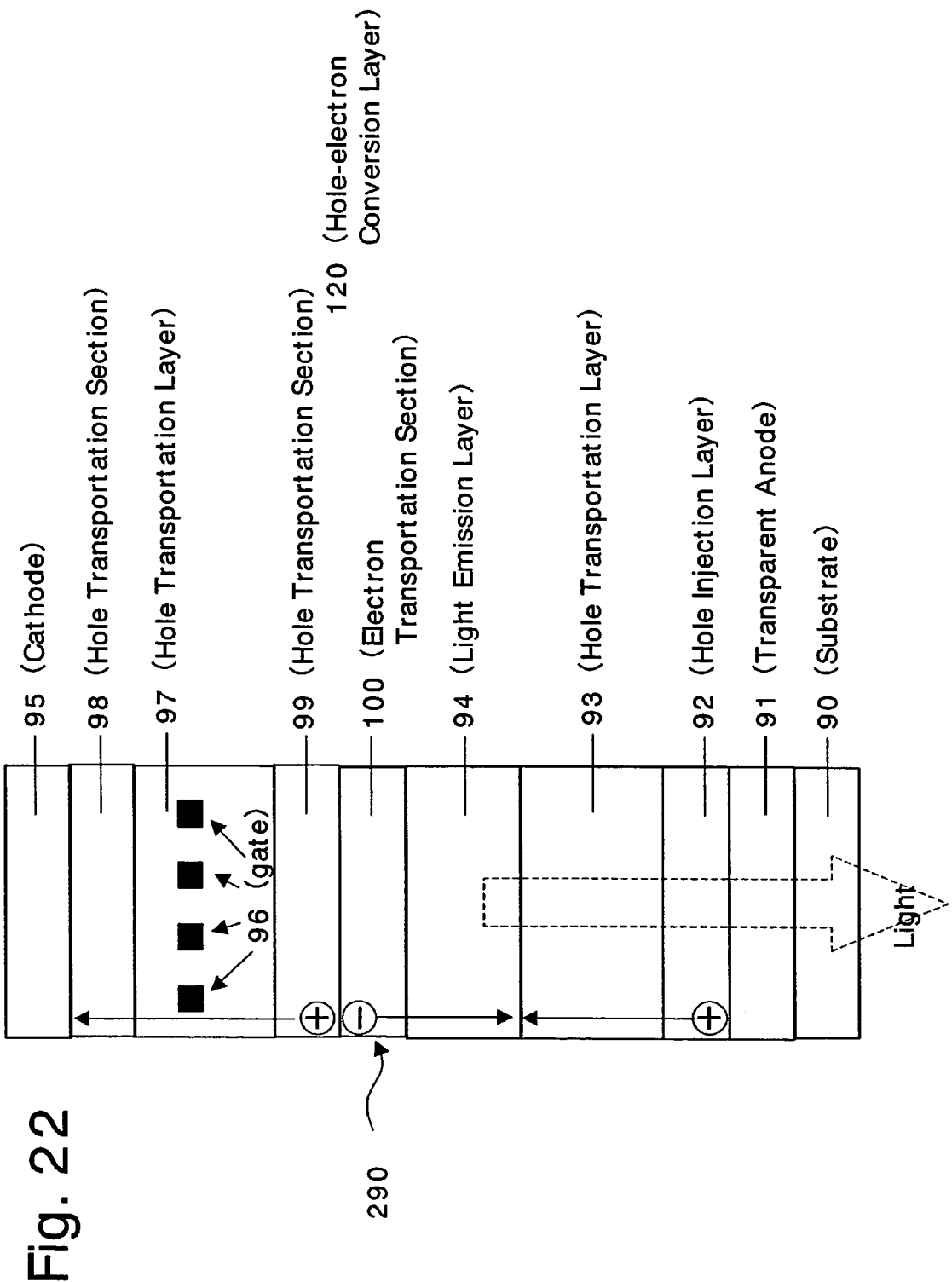
FIG. 22 is a cross-sectional view schematically showing the structure of the organic EL device having the FET structure according to Example 9 of the present invention.

Contrary to this, according to the present invention, it becomes possible to achieve a novel organic device structure which could not be achieved in the prior art organic EL transistor structures, by the application of the hole current-electron current conversion layer of the present invention. For example, as illustrated in FIG. 22, a hole transportation layer 97 can be disposed as a layer contacting the cathode 95. In the illustrated device structure, a hole transportation section 98 consisting of, for example, $V_2O_5$ (electron-accepting compound) and NPB (electron-donating organic compound) can be produced between the cathode 95 and the hole transportation layer 97, and a hole transportation section 99 and an electron transportation section 100 which constitute the hole current-electron current conversion layer 120 of the present invention can be produced between the light emission layer 94 and the hole transportation layer 97. In the organic EL transistor 290 of the illustrated structure, slit-like gate electrodes 96 are embedded in the section of the hole transportation layer 97 to obtain the transistor characteristics without modifying the structure of the prior art organic EL device section.

Figure 23:
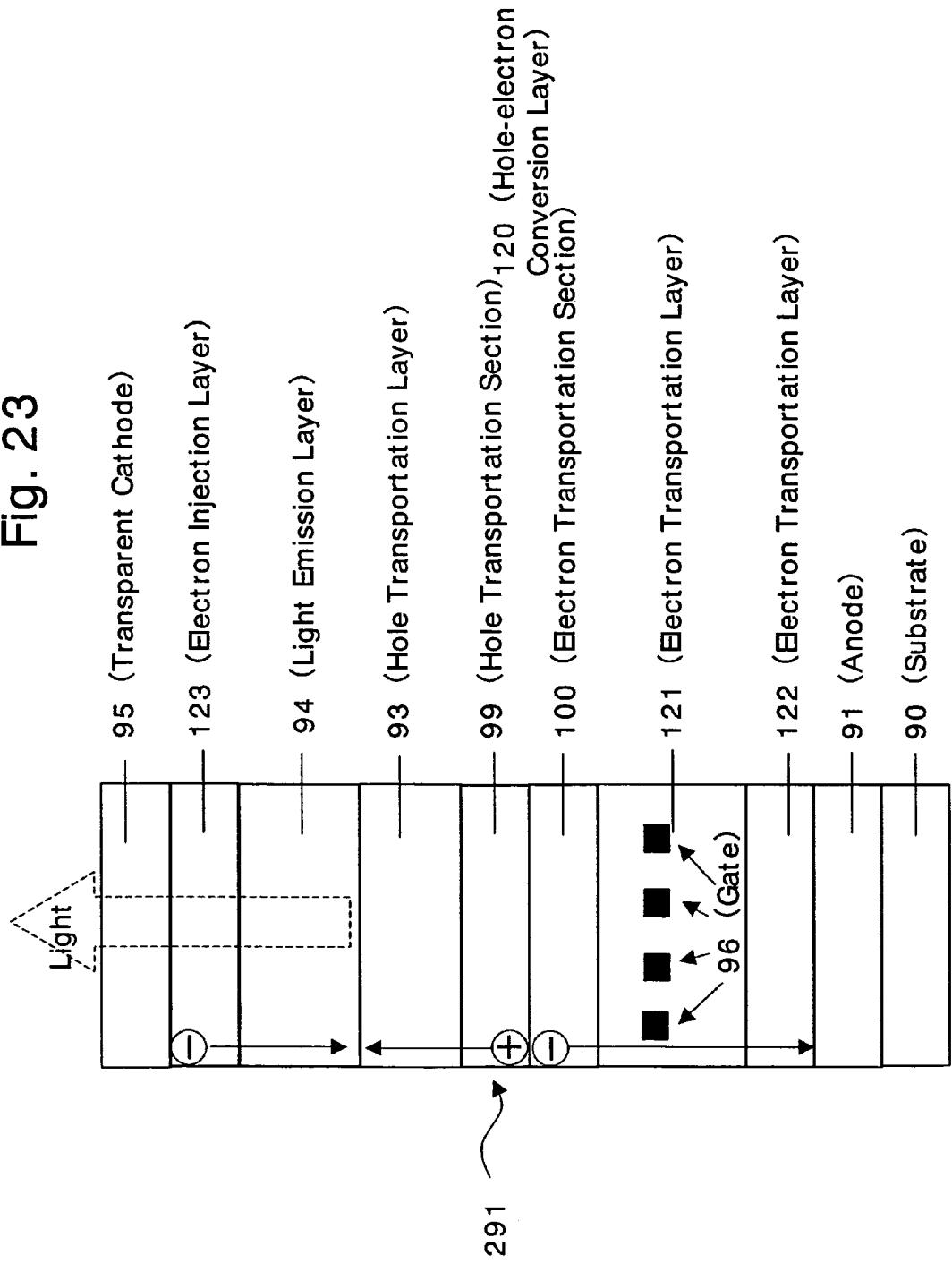
FIG. 23 is another cross-sectional view schematically showing the structure of the organic EL device having the FET structure according to Example 9 of the present invention.
Figure 24:
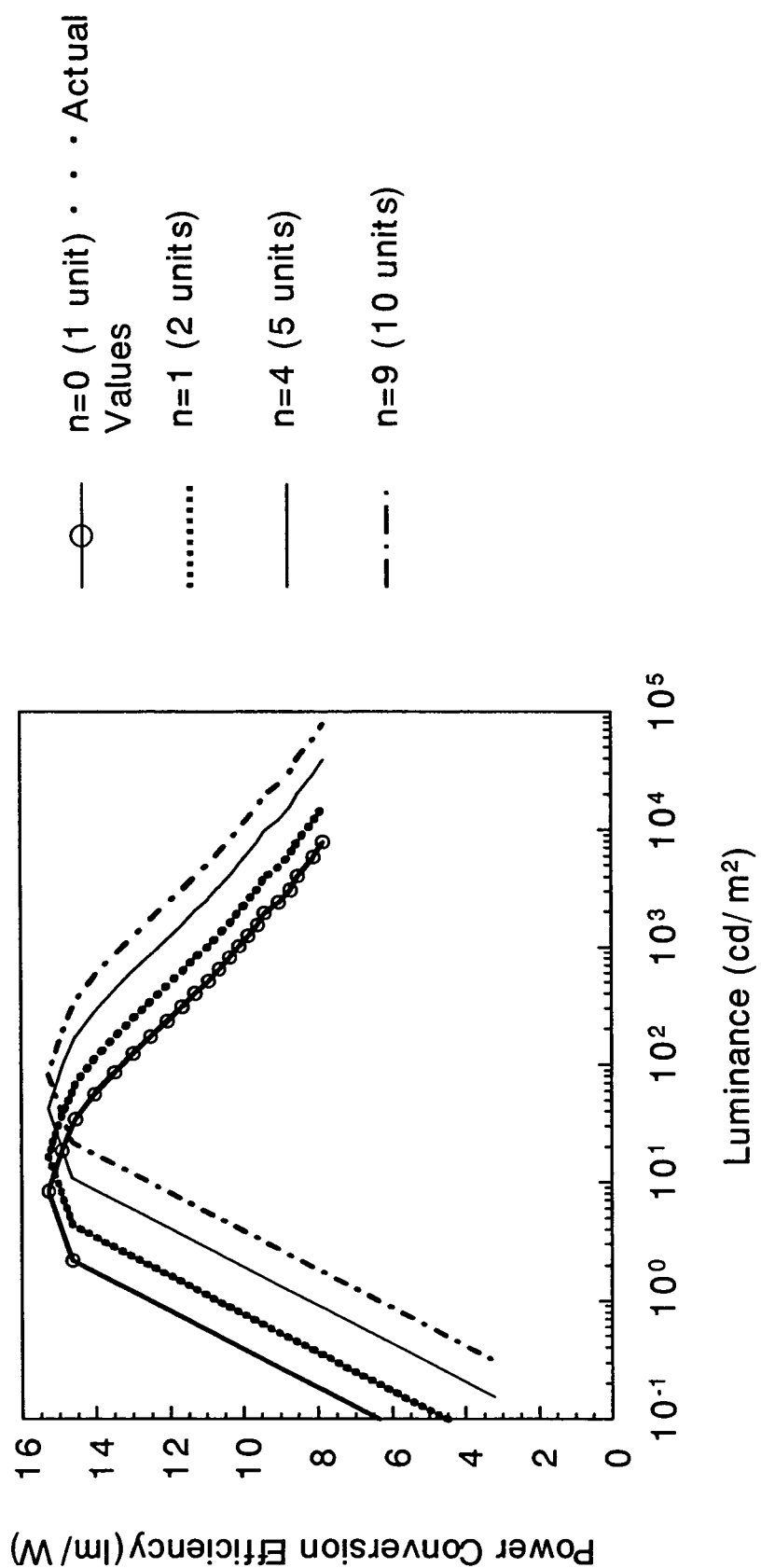
FIG. 24 is a graph showing the results of the simulation test in which a variation of the power conversion efficiency (lm/W) with different luminance when the conventional organic EL device structures were stacked through a charge generation layer at 2 units (n=1), 5 units (n=4) or 10 units (n=9) wherein n designates a number of the charge generation layers applied.
Figure 25:
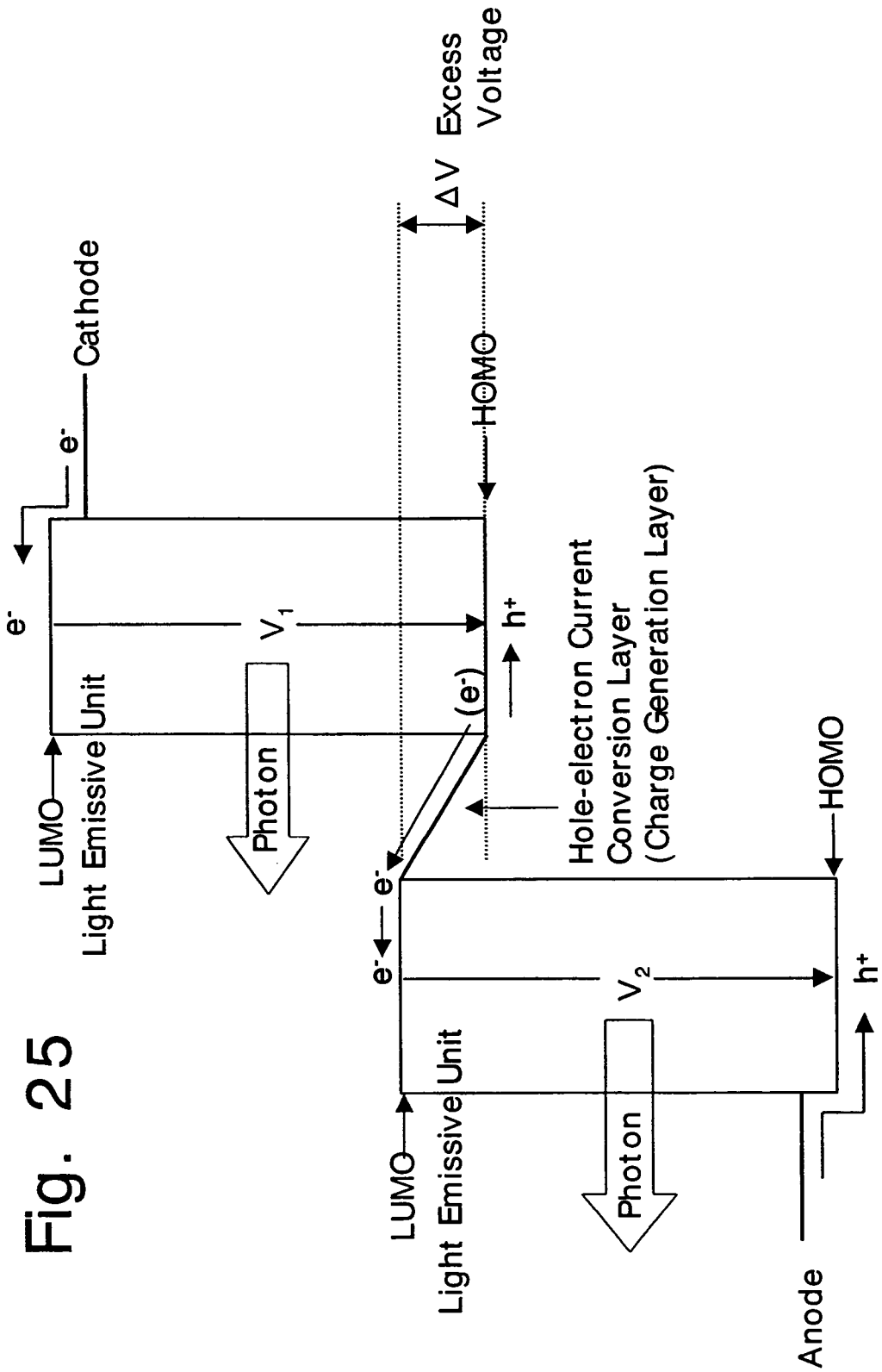
FIG. 25 is a band diagram of the organic MPE EL device having two light emissive units obtained with application of the driving voltage of $V_1+V_2+\Delta V$ and with neglect of injection barriers from the cathode and anode.
Figure 26:
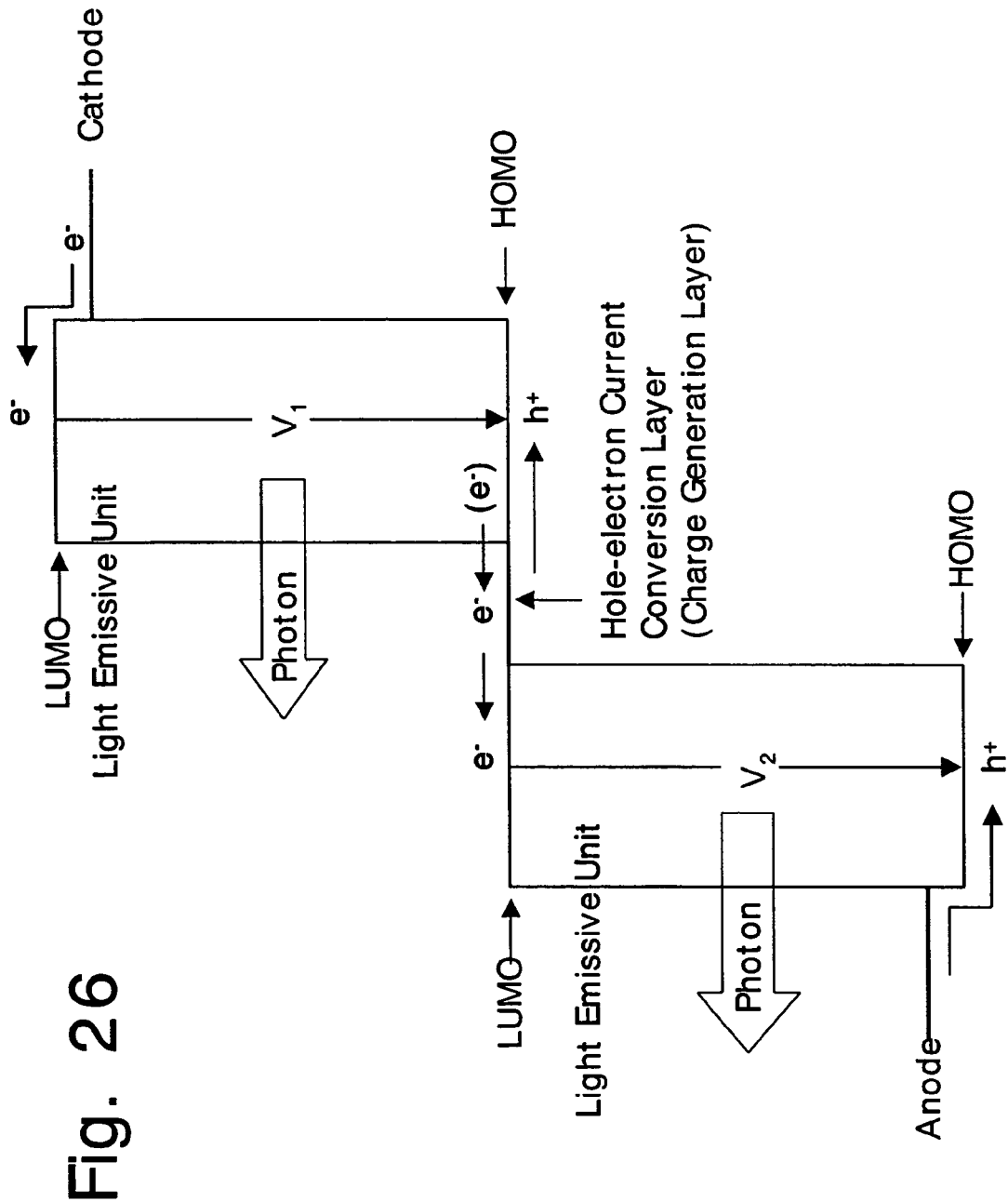
FIG. 26 is a band diagram of the organic MPE EL device having two light emissive units obtained with application of the driving voltage of $V_1+V_2$ and with neglect of injection barriers from the cathode and anode.

Alternatively, for example, an electron transportation layer 121 can be disposed as a layer contacting an anode 91, as illustrated in FIG. 23. In the illustrated organic device structure, an electron transportation section 122 can be produced between the anode 91 and the electron transportation layer 121, and a hole transportation section 99 and an electron transportation section 100 which constitute the hole current-electron current conversion layer 120 of the present invention can be produced between the electron transportation layer 121 and the hole transportation layer 93. Furthermore, an electron injection layer 123 is generated between the transparent cathode 95 and the light emission layer 94. In the organic EL transistor 291 of the illustrated structure, slit-like gate electrodes 96 are embedded in the electron transportation layer 121 to obtain the transistor characteristics without modifying the structure of the prior art organic EL device section. Of course, it is also possible to dispose a hole transportation layer as a layer contacting the cathode, dispose an electron transportation layer as a layer contacting the anode, and embed a gate electrode in both of the hole transportation layer and the electron transportation layer, thereby enabling to obtain characteristics which could not be achieved in prior art organic devices.

According to the present invention, the drawbacks of conventional organic devices can be overcome by using a hole current-electron current conversion layer (hole-electron conversion layer), which is formed by sequentially stacking two layers, one layer acting as an electron transportation section and the other layer acting as a hole transportation layer, in a wide variety of the organic devices as a result of universalization of the hole-electron conversion layer and its specific advantages, for example, by not only applying the hole-electron conversion layer to a charge generation layer of the organic MPE EL devices, but also using the hole-electron conversion layer as a connection layer in the conventional organic solar cells for the purpose of connection in series of two or more cells, and using the hole-electron conversion layer as a buffer layer during the process of electrodes formation in the generally used organic devices.

The organic devices of the present invention can exhibit a good transparency, because the thermal reduction reaction-generated layer (electron transportation section) used therein does not contain aluminum as a metal atom, i.e., aluminum is contained in the state of metal ions (oxidation state).

Furthermore, the organic devices of the present invention can provide an advantage in the production process, because careful handling of the reducing dopants is not necessary during the production of the organic devices. Note that substantially all of the reducing dopants conventionally used in the art, typically alkaline metals, are highly reactive and are easily ignited in atmospheric air.

Furthermore, according to the present invention, it becomes possible in the organic devices to include a layer having a high transparency and a good (low) resistivity comparable to that of the electron transportation layer having incorporated therein a reducing dopant disclosed by the inventors of this application in Japanese Patent Application Laid-open Nos. 10-270171 and 2001-102175.

In the thermal reduction reaction-generated layer (electron transportation sections), since thermally reducible metals such as aluminum and magnesium, etc., do not already exist as metal atoms, but rather exist in an ion state (oxidized state), incorporation of these metals can facilitate transparency of said layer.

Obvious changes may be made in the specific embodiments of the present invention described herein, such modifications being within the spirit and scope of the invention claimed. It is indicated that all matter contained herein is illustrative and does not limit the scope of the present invention.

The invention claimed is:

1. An organic device comprising in order:
   a glass substrate;
   an anode;
   a hole transportation layer;
   a light emission layer;
   a layer including Alq and Liq with a molar ratio of 1:1;
   a thermally reducible metal layer of aluminum;
   a hole current-electron current conversion layer including an electron transportation section and a hole transportation section in contact with each other; and
   a cathode,
   wherein said hole current-electron current conversion layer functions as a buffer layer against a high energy particle deposition when said cathode is being formed, wherein said hole transportation section consists of NPD and vanadium pentoxide, and wherein said hole transportation section is transparent to light and is in contact with the cathode, and
   wherein the amount of aluminum in the thermally reducible metal layer is the amount needed to reduce all the lithium ions in the Liq of the Liq/Alq layer to lithium metal, such that the thermally reducible metal layer consists of aluminum ions.

2. An organic device having a cathode and a hole current-electron current conversion layer, said hole current-electron current conversion layer comprising a stacked laminate of an electron transportation section and a hole transportation section in contact with each other, the hole transportation section being in contact with the cathode, said electron transportation section including a charge transfer complex formed upon an oxidation-reduction reaction between Li and Alq, said Li being produced upon an in-situ thermal reduction reaction caused by lamination of Al ions onto a co-deposition layer of Liq and Alq to form a thermally reducible metal layer between ten (10) and twenty (20) angstroms thickness, and said Alq being in the state of radical cations, and the electron-donating organic compound is in the state of radical cations comprising, in order:
   a substrate;
   an anode;
   a light transparent hole transportation layer consisting of NPB;
   an Alq light emission layer;
   a layer consisting of Alq and Liq in a molar ratio of 1:1
   a thermally reducible metal layer of aluminum;
   a hole transportation section of NPB and $V_2O_5$ in a molar ratio of 1:1; and
   an aluminum cathode,
   wherein the amount of aluminum in the thermally reducible metal layer is the amount needed to reduce all the lithium ions in the Liq of the Liq/Alq layer to lithium metal, such that the thermally reducible metal layer consists of aluminum ions and wherein said hole current-electron current conversion layer functions as a buffer layer against a high energy particle deposition when said cathode is being formed.

3. An organic device having a cathode and a hole current-electron current conversion layer, said hole current-electron current conversion layer comprising a stacked laminate of an electron transportation section and a hole transportation section in contact with each other, the hole transportation section being in contact with the cathode, said electron transportation section including a charge transfer complex formed upon an oxidation-reduction reaction between Li and Alq, said Li being produced upon an in-situ thermal reduction reaction caused by lamination of Al ions onto a co-deposition layer of Liq and Alq to form a thermally reducible metal layer between ten (10) and twenty (20) angstroms thickness, and said Alq being in the state of radical anions, and the electron-donating organic compound is in the state of radical cations consisting of, in order:
   a glass substrate;
   an ITO anode;
   a light transparent hole transportation layer consisting of NPB;
   an Alq light emission layer;
   a layer consisting of Alq and Liq in a molar ratio of 1:1
   a thermally reducible metal layer of aluminum;
   a hole transportation section consisting of NPB and $V_2O_5$ in a molar ratio of 1:1; and
   an aluminum cathode,
wherein the amount of aluminum in the thermally reducible metal layer is the amount needed to reduce all the lithium ions in the Liq of the Liq/Alq layer to lithium metal, such that the thermally reducible metal layer consists of aluminum ions.

4. An organic device comprising in order:
   a glass substrate;
   an anode;
   a hole transportation layer;
   a light emission layer;
   a layer including Alq and Liq with a molar ratio of 1:1;
   a thermally reducible metal layer of aluminum;
   a hole current-electron current conversion layer including an electron transportation section and a hole transportation section in contact with each other; and
   a cathode,
   wherein said hole current-electron current conversion layer functions as a buffer layer against a high energy particle deposition when said cathode is being formed,
   wherein said hole transportation section includes an organic compound having an ionization potential of less than 5.7 eV and an electron-donating property, and an inorganic or organic substance capable of forming a charge transfer complex through its oxidation-reduction reaction with the organic compound upon contact through its lamination or mixing to said organic compound, the electron-donating organic compound being in the state of radical cations, wherein said hole transportation section is transparent to light and is in contact with the cathode, and wherein the amount of aluminum in the thermally reducible metal layer is the amount needed to reduce all the lithium ions in the Liq of the Liq/Alq layer to lithium metal, such that the thermally reducible metal layer consists of aluminum ions.

5. An organic device having a cathode and a hole current-electron current conversion layer, said hole current-electron current conversion layer comprising a stacked laminate of an electron transportation section and a hole transportation section in contact with each other, the hole transportation section being in contact with the cathode, said electron transportation section including a charge transfer complex formed upon an oxidation-reduction reaction between Li and Alq, said Li being produced upon an in-situ thermal reduction reaction caused by lamination of Al ions onto a co-deposition layer of Liq and Alq to form a thermally reducible metal layer between ten (10) and twenty (20) angstroms thickness, and said Alq being in the state of radical anions, and the electron-donating organic compound is in the state of radical cations comprising, in order:

a substrate;
an anode;
a light transparent hole transportation layer including an organic compound having an ionization potential of less than 5.7 eV and an electron-donating property, and an inorganic or organic substance capable of forming a charge transfer complex through its oxidation-reduction reaction with the organic compound upon contact through its lamination or mixing to said organic compound;
a light emission layer;
a layer consisting of Alq and Liq in a molar ratio of 1:1
a thermally reducible metal layer of aluminum;
a hole transportation section of NBP and $V_2O_5$ in a molar ration of 1:1; and
an aluminum cathode,
wherein the amount of aluminum in the thermally reducible metal layer is the amount needed to reduce all the lithium ions in the Liq of the Liq/Alq layer to lithium metal, such that the thermally reducible metal layer consists of aluminum ions and wherein said hole current-electron current conversion layer functions as a buffer layer against a high energy particle deposition when said cathode is being formed.

6. An organic device having a cathode and a hole current-electron current conversion layer, said hole current-electron current conversion layer comprising a stacked laminate of an electron transportation section and a hole transportation section in contact with each other, the hole transportation section being in contact with the cathode, said electron transportation section including a charge transfer complex formed upon an oxidation-reduction reaction between Li and Alq, said Li being produced upon an in-situ thermal reduction reaction caused by lamination of Al ions onto a co-deposition layer of Liq and Alq to form a thermally reducible metal layer between ten (10) and twenty (20) angstroms thickness, and said Alq being in the state of radical anions, and the electron-donating organic compound is in the state of radical cations consisting of, in order:

a glass substrate;
an ITO anode;
a light transparent hole transportation layer including an organic compound having an ionization potential of less than 5.7 eV and an electron-donating property, and an inorganic or organic substance capable of forming a charge transfer complex through its oxidation-reduction reaction with the organic compound upon contact through its lamination or mixing to said organic compound;
a light emission layer;
a layer consisting of Alq and Liq in a molar ratio of 1:1
a thermally reducible metal layer of aluminum;
a hole transportation section consisting of NPB and $V_2O_5$ in a molar ratio of 1:1; and
an aluminum cathode,
wherein the amount of aluminum in the thermally reducible metal layer is the amount needed to reduce all the lithium ions in the Liq of the Liq/Alq layer to lithium metal, such that the thermally reducible metal layer consists of aluminum ions.

* * * * *